US00RE45687E

(19) United States
(12) Reissued Patent
Saito et al.

(10) Patent Number: US RE45,687 E
(45) Date of Reissued Patent: Sep. 29, 2015

(54) PLATING APPARATUS AND PLATING METHOD

(71) Applicant: Ebara Corporation, Tokyo (JP)

(72) Inventors: Nobutoshi Saito, Tokyo (JP); Jumpei Fujikata, Tokyo (JP); Tadaaki Yamamoto, Tokyo (JP); Kenji Kamimura, Tokyo (JP)

(73) Assignee: EBARA CORPORATION, Tokyo (JP)

(21) Appl. No.: 14/272,891

(22) Filed: May 8, 2014

Related U.S. Patent Documents

Reissue of:
(64) Patent No.: 8,177,944
Issued: May 15, 2012
Appl. No.: 12/314,143
Filed: Dec. 4, 2008

(30) Foreign Application Priority Data

Dec. 4, 2007 (JP) ..... 2007-313730
Nov. 14, 2008 (JP) ..... 2008-292174

(51) Int. Cl.

| | |
|---|---|
| ***C25D 5/00*** | (2006.01) |
| ***C25D 7/12*** | (2006.01) |
| ***C25D 17/00*** | (2006.01) |
| ***C25D 17/02*** | (2006.01) |
| ***C25D 17/04*** | (2006.01) |
| ***C25D 17/06*** | (2006.01) |
| ***C25D 21/10*** | (2006.01) |
| ***C25D 21/12*** | (2006.01) |

(52) U.S. Cl.
CPC ..... *C25D 21/10* (2013.01); *C25D 17/007* (2013.01); *C25D 17/008* (2013.01); *C25D 21/12* (2013.01); *C25D 17/001* (2013.01)

(58) Field of Classification Search
CPC ..... C25D 21/10; C25D 21/12; C25D 17/007; C25D 17/008; C25D 17/001
USPC ..... 204/230.7, 230.2, 252; 205/157, 96, 97
See application file for complete search history.

(56) References Cited

U.S. PATENT DOCUMENTS 3,652,442 A * 3/1972 Powers et al. ..... 204/273
3,699,015 A * 10/1972 Wisdom ..... 205/93
5,312,532 A * 5/1994 Andricacos et al. ..... 204/299.4

(Continued)

FOREIGN PATENT DOCUMENTS

CN 1894442 1/2007
JP 57-67192 4/1982

(Continued)

*Primary Examiner* — Alan Diamond
(74) *Attorney, Agent, or Firm* — Wenderoth, Lind & Ponack, L.L.P.

(57) ABSTRACT

A plating apparatus can form a bump having a flat top or can form a metal film having a good in-plane uniformity even when the plating of a plating object (substrate) is carried out under high-current density conditions. The plating apparatus includes a plating tank for holding a plating solution; an anode to be immersed in the plating solution in the plating tank; a holder for holding a plating object and disposing the plating object at a position opposite the anode; a paddle, disposed between the anode and the plating object held by the holder, which reciprocates parallel to the plating object to stir the plating solution; and a control section for controlling a paddle drive section which drives the paddle. The control section controls the paddle drive section so that the paddle moves at a velocity whose average absolute value is 70 cm/sec to 100 cm/sec.

22 Claims, 38 Drawing Sheets

(56) References Cited

U.S. PATENT DOCUMENTS

| | | | | |
|---|---|---|---|---|
| 5,516,412 | A * | 5/1996 | Andricacos et al. | 204/224 R |
| 5,522,975 | A * | 6/1996 | Andricacos et al. | 204/288.1 |
| 5,883,762 | A * | 3/1999 | Calhoun et al. | 205/119 |
| 6,004,440 | A * | 12/1999 | Hanson et al. | 204/279 |
| 6,126,798 | A | 10/2000 | Reid et al. | |
| 6,179,983 | B1 | 1/2001 | Reid et al. | |
| 6,365,017 | B1 | 4/2002 | Hongo et al. | |
| 6,527,920 | B1 | 3/2003 | Mayer et al. | |
| 6,793,749 | B2 | 9/2004 | Fogal et al. | |
| 6,955,747 | B2 * | 10/2005 | Browne et al. | 204/273 |
| 7,247,223 | B2 * | 7/2007 | McHugh et al. | 204/275.1 |
| 7,294,244 | B2 * | 11/2007 | Oberlitner et al. | 204/273 |
| 7,390,382 | B2 * | 6/2008 | McHugh et al. | 204/230.3 |
| 7,402,227 | B2 | 7/2008 | Yoshioka et al. | |
| 7,445,697 | B2 | 11/2008 | Keigler et al. | |
| 7,601,248 | B2 | 10/2009 | Yoshioka et al. | |
| 7,833,393 | B2 | 11/2010 | Yoshioka et al. | |
| 7,857,958 | B2 * | 12/2010 | McHugh et al. | 205/96 |
| 7,875,158 | B2 | 1/2011 | Kuriyama et al. | |
| 2004/0262150 | A1 * | 12/2004 | Yajima et al. | 204/224 R |
| 2005/0000817 | A1 * | 1/2005 | McHugh et al. | 205/89 |
| 2005/0006241 | A1 * | 1/2005 | McHugh et al. | 205/80 |
| 2005/0167275 | A1 * | 8/2005 | Keigler et al. | 205/96 |
| 2005/0178667 | A1 | 8/2005 | Wilson et al. | |
| 2006/0131162 | A1 * | 6/2006 | Schroeck et al. | 204/196.29 |
| 2009/0301395 | A1 | 12/2009 | Sekimoto et al. | |

FOREIGN PATENT DOCUMENTS

| | | |
|---|---|---|
| JP | 6-17297 | 1/1994 |
| JP | 11-193497 | 7/1999 |
| JP | 2001-329400 | 11/2001 |
| JP | 2002-322596 | 11/2002 |
| JP | 2005-29863 | 2/2005 |
| JP | 2006-041172 | 2/2006 |
| JP | 2006-152415 | 6/2006 |
| JP | 2007-527948 | 10/2007 |
| WO | 2004/009879 | 1/2004 |
| WO | 2004/110698 | 12/2004 |
| WO | 2005/042804 | 5/2005 |
| WO | 2006/114305 | 11/2006 |
| WO | WO 2006/114305 A1 * | 11/2006 |

* cited by examiner

PLATING APPARATUS AND PLATING METHOD

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*The present application is a reissue application of U.S. Pat. No. 8,177,944, which issued on May 15, 2012 from application Ser. No. 12/314,143, filed Dec. 4, 2008.*

BACKGROUND OF THE INVENTION

1. Field of the Invention

The present invention relates to a plating apparatus and a plating method for carrying out plating of a surface of a plating object (substrate), such as a semiconductor wafer, and more particularly to a plating apparatus and a plating method useful for forming a plated film in fine interconnect recesses or holes or resist openings, provided in a surface of a semiconductor wafer, or for forming bumps (protruding electrodes), which are for electrical connection to, e.g., electrodes of a package, on a surface of a semiconductor wafer.

2. Description of the Related Art

It is common practice, e.g., in TAB (tape automated bonding) or flip chip to form protruding connection electrodes (bumps) of gold, copper, solder or nickel, or of multiple layers of such metals at predetermined portions (electrodes) of a surface of a semiconductor chip, having interconnects formed therein, so that the semiconductor chip can be electrically connected via the bumps to electrodes of a package or TAB electrodes. There are various methods available for the formation of bumps, such as electroplating, vapor deposition, printing and ball bumping. Of these, electroplating, which can form fine bumps and can be performed in a relatively stable manner, is most commonly used as the I/O number of a semiconductor chip increases and the electrode pitch becomes smaller.

A high-purity metal film (plated film) can be obtained with ease by electroplating. Further, electroplating can not only form a metal film at a relatively high rate, but can also control a thickness of the metal film relatively easily. In the formation of a metal film on a semiconductor wafer, the in-plane uniformity of a thickness of the metal film is strictly required in order to attain high-density packaging, high performance and high yield. When electroplating is used to form a metal film, the distribution of metal ion feed rate and the distribution of electric potential in a plating solution can be made uniform. It is therefore expected that electroplating will be capable of obtaining a metal film excellent in the in-plane thickness uniformity.

Among plating apparatuses that employ a so-called dipping method, a plating apparatus is known which comprises a plating tank for holding therein a plating solution; a substrate holder for holding a substrate (plating object) vertically with its peripheral portion watertightly sealed thereby; an anode vertically held by an anode holder and disposed so as to face the substrate in the plating tank; a regulation plate of dielectric material, having a central hole, disposed between the anode and the substrate; and a paddle disposed between the regulation plate and the substrate for stirring the plating solution (see, e.g., International Publication No. WO 2004/009879 pamphlet, patent document 1).

In operation of the plating apparatus described in the patent document 1, the anode, the substrate and the regulation plate are immersed in the plating solution in the plating tank while the anode is connected to an anode of a plating power source and the substrate is connected to a cathode of the plating power source via conducting wires, and a predetermined plating voltage is applied between the anode and the substrate, thereby depositing a metal and forming a metal film (plated film) on the surface of the substrate. During the plating, the plating solution is stirred with the paddle disposed between the regulation plate and the substrate so as to uniformly supply a sufficient amount of ions to the substrate, thereby forming a metal film having a more uniform thickness.

According to the plating apparatus of the patent document 1, the distribution of electric potential in the plating tank can be controlled by the regulation plate, having a plating solution passage in a cylindrical body, disposed between the anode and the substrate disposed opposite the anode. This enables control of a thickness distribution of a metal film formed on the surface of the substrate.

Further, a plating apparatus has been proposed which, by minimizing the distance between a regulation plate and a plating object, both immersed in a plating solution in a plating tank, can make the distribution of electric potential more uniform over an entire surface of the plating object, thereby forming a metal film having a more uniform thickness (see, e.g., Japanese Patent Laid-open Publication No. 2001-329400, patent document 2).

These days, in order to increase productivity, there is a strong demand to shorten plating time taken for forming a plated film having a given thickness to about ⅔ of the conventional plating time. In order to form a plated film having a given thickness and a given plating area in a shorter time, it is necessary to carry out plating at a higher plating rate by applying a higher current, i.e., at a higher current density. However, if plating is carried out under high-current density conditions using a conventional common plating apparatus and its operating method, the in-plane uniformity of a thickness of a plated film tends to become worse. The in-plane uniformity of the thickness of the plated film is required to be at a higher level than ever. Therefore, shortening the distance between a regulation plate and a plating object, as described in the patent document 2, is therefore important in carrying out plating under high-current density plating conditions.

It has been found by the present inventors that, when plating is carried out under high-current density conditions using a conventional common plating apparatus and its operating method, bumps formed by the plating tend to have a convex top, not a flat top. The formation of such convex-top bumps would cause the following problems: In WL-CSP (wafer level-chip size package) currently under development, after forming bumps by plating, the bumps are coated with a resin. If bumps have a convex top shape, an excess amount of resin must be applied to cover the entire bumps, leading to an increased cost. After the application of a resin, a surface of the resin is usually leveled with a spatula, called squeegee. A tall bump with a convex top can fall down upon leveling of the resin surface with a spatula (squeeze). After coating bumps with a resin, it is also a common practice to polish the resin and the bumps to a predetermined thickness by mechanical polishing. If the bumps have a convex top and therefore the resin has been applied in an excess amount, then the excess resin must be polished away, resulting in increased cost.

A plating apparatus and method has been proposed in which plating of a printed circuit board having through-holes is carried out while driving a pair of stirring bars, one at 5 cm/sec to 20 cm/sec and the other at 25 cm/sec to 70 cm/sec, in a plating solution (see, e.g., Japanese Patent Laid-open Publication No. 2006-41172, patent document 3). However, bumps having a flat top will not be formed if plating is carried out while moving a pair of stirring bars respectively at such a velocity.

SUMMARY OF THE INVENTION

The present invention has been made in view of the above situation in the related art. It is therefore an object of the present invention to provide a plating apparatus and a plating method which, when carrying out plating of a plating object (substrate) such as a semiconductor wafer, can form a bump having a flat top or can form a metal film having a good in-plane uniformity even when the plating is carried out under high-current density conditions.

In order to achieve the object, the present invention provides a plating apparatus comprising: a plating tank for holding a plating solution; an anode to be immersed in the plating solution in the plating tank; a holder for holding a plating object and disposing the plating object at a position opposite the anode; a paddle, disposed between the anode and the plating object held by the holder, which reciprocates parallel to the plating object to stir the plating solution; and a control section for controlling a paddle drive section which drives the paddle. The control section controls the paddle drive section so that the paddle moves at a velocity whose average absolute value is 70 cm/sec to 100 cm/sec.

By moving the paddle, disposed between the anode and the plating object, at such a (high) velocity that its average absolute value is 70 cm/sec to 100 cm/sec and to thereby stir the plating solution, for example, a sufficient amount of ions can be supplied uniformly into resist holes which have previously been formed for the formation of bumps, making it possible to form bumps having a flat top even plating is carried out under high-current density conditions.

The paddle preferably is a plate-like member having strip-shaped portions. The plate-like member preferably has a thickness of 3 mm to 5 mm.

Each strip-shaped portion of the paddle is inclined at preferably 30° to 60°, more preferably 40° to 50°, to a vertical plane parallel to the plating object.

Each strip-shaped portion of the paddle has a width of preferably 2 mm to 8 mm, more preferably 3 mm to 6 mm.

Preferably, the distance between the paddle and the plating object is 5 mm to 11 mm.

In a preferred aspect of the present invention, the plating apparatus further comprises a regulation plate of dielectric material disposed between the anode and the paddle. The regulation plate includes a cylindrical portion having an inner diameter adapted to the contour of the plating object, and a flange portion, connected to the anode-side peripheral end of the cylindrical portion, for regulating an electric field formed between the anode and the plating object.

The provision of the regulation plate between the anode and the paddle can make the distribution of electric potential more uniform over an entire surface of a plating object. This makes it possible to enhance the in-plane uniformity of a metal film (plated film) formed on the plating object even when the metal film is formed under high-current density plating conditions.

The distance between the plating object and the plating object-side end of the cylindrical portion of the regulation plate is preferably 8 mm to 25 mm, more preferably 12 mm to 18 mm.

In a preferred aspect of the present invention, the holder has an outwardly-projecting holder arm and the plating tank has a holder support for contact with the holder arm to hang and support the holder thereon. A fixing member for fixing the holder arm to the holder support is provided in the area of contact between the holder arm and the holder support.

With this structure, the holder, which is being hung and supported on the plating tank, can be prevented from swinging or tilting even when the holder receives a backward pressure from the flow of the plating solution caused by high-speed movement of the paddle.

Preferably, the fixing member is a magnet provided in at least one of the holder arm and the holder support. The use of a magnetic force can ensure good fixing.

In a preferred aspect of the present invention, the holder arm and the holder support have, at least in part of the area of contact between them, contacts which come into contact with each other and close when the holder is hung and supported on the plating tank and which, when closed, allow feeding of electricity to the plating object.

This can ensure good contact between the contact of the holder arm and the contact of the holder support when the holder is hung and supported on the plating tank.

The present invention also provides a plating method comprising: disposing an anode and a plating object opposite to each other in a plating solution in a plating tank; and reciprocating a paddle, disposed between the anode and the plating object, parallel to the plating object at a velocity whose average absolute value is 70 cm/sec to 100 cm/sec while applying a voltage between the anode and the plating object.

The paddle preferably is a plate-like member having strip-shaped portions. The plate-like member preferably has a thickness of 3 mm to 5 mm.

Each strip-shaped portion of the paddle is inclined at preferably 30° to 60°, more preferably 40° to 50°, to a vertical plane parallel to the plating object.

Each strip-shaped portion of the paddle has a width of preferably 2 mm to 8 mm, more preferably 3 mm to 6 mm.

Preferably, the distance between the paddle and the plating object is 5 mm to 11 mm.

In a preferred aspect of the present invention, a regulation plate of dielectric material is disposed between the anode and the paddle. The regulation plate includes a cylindrical portion having an inner diameter adapted to the contour of the plating object, and a flange portion, connected to the anode-side peripheral end of the cylindrical portion, for regulating an electric field formed between the anode and the plating object.

The distance between the plating object and the plating object-side end of the cylindrical portion of the regulation plate is preferably 8 mm to 25 mm, more preferably 12 mm to 18 mm.

The present invention also provides a plating apparatus comprising: a plating tank for holding a plating solution; an anode to be immersed in the plating solution in the plating tank; a holder for holding a plating object and disposing the plating object at a position opposite the anode; a paddle, disposed between the anode and the plating object held by the holder, which reciprocates parallel to the plating object to stir the plating solution; and a control section for controlling a paddle drive section which drives the paddle. The plating tank is separated into a plating object processing chamber and a plating solution distribution chamber by a separation plate having a large number of plating solution passage holes. The plating solution distribution chamber is provided with a shield plate for regulating an electric field while ensuring distributed flows of the plating solution.

By thus separating the plating tank by the separation plate into the upper plating object processing chamber and the lower plating solution distribution chamber, and providing the shield plate in the plating solution distribution chamber to suppress the formation of electric field, directed from the anode toward a plating object, in the plating solution distribution chamber, it becomes possible to prevent the formation of an electric field below the plating object, thus preventing the electric field from affecting the in-plane uniformity of a plated film. The influence of an electric field, formed below a plating object, on the in-plane uniformity of a plated film is not problematic when plating is carried out under conventional low-current density conditions. In the case of high-current density conditions, on the other hand, the influence of such an electric field is problematic because of a rapid increase in a thickness of a plated film in its portion near the bottom of the plating tank.

In a preferred aspect of the present invention, the plating apparatus further comprises a regulation plate of dielectric material disposed between the anode and the paddle. The regulation plate includes a cylindrical portion having an inner diameter adapted to the contour of the plating object, and a flange portion, connected to the anode-side peripheral end of the cylindrical portion, for regulating an electric field formed between the anode and the plating object. An electric field-shielding member, which is in contact with the separation plate, is attached to the lower end of the flange portion.

The provision of the regulation plate can control the electric field formed between the anode and a plating object and, in addition, the provision of the electric field-shielding member between the flange portion and the separation plate can prevent leakage of electric field from the gap between the flange portion and the separation plate.

In a preferred aspect of the present invention, the plating solution distribution chamber is separated by the shield plate into an anode-side solution distribution chamber and a cathode-side solution distribution chamber. The plating solution is supplied though a plating solution supply route to the anode-side solution distribution chamber and the cathode-side solution distribution chamber.

By thus completely separating the plating solution distribution chamber into the anode-side solution distribution chamber and the cathode-side solution distribution chamber by the shield plate, it becomes possible to securely prevent potential lines, generated from the anode, from passing through the plating solution in the plating solution distribution chamber and reaching a plating object which serves as a cathode.

In a preferred aspect of the present invention, the paddle is coupled via a coupling to a shaft extending from the paddle drive section.

With this structure, the paddle can be easily separated via the coupling from the shaft extending from the paddle drive section. This enables a quick and easy operation for replacement of the paddle.

The present invention also provides a plating apparatus comprising: a plating tank for holding a plating solution; an anode to be immersed in the plating solution in the plating tank; a holder for holding a plating object and disposing the plating object at a position opposite the anode; a paddle, disposed between the anode and the plating object held by the holder, which reciprocates parallel to the plating object to stir the plating solution; a control section for controlling a paddle drive section which drives the paddle; a regulation plate of dielectric material disposed between the anode and the paddle; and a regulation plate movement mechanism for moving the regulation plate vertically or horizontally parallel to the plating object.

The regulation plate movement mechanism can finely adjust the vertical or horizontal position of the regulation plate with respect to a plating object, thereby enhancing the in-plane uniformity of a thickness of a plated film formed on the surface of the plating object. Since the regulation plate is disposed at a position close to a plating object, fine adjustment of the vertical or horizontal position of the regulation plate with respect to the plating object is important to enhancement of the in-plane uniformity of a thickness of a plated film formed on the plating object.

Preferably, the regulation plate movement mechanism includes a press member for pressing on the regulation plate to move the regulation plate.

The press member is, for example, a press bolt. The movement distance of the regulation plate can be controlled with ease by controlling the degree of pressing by the press member, in particular, by controlling the number of revolutions of a pressing volt having a predetermined pitch when it is used as the press member.

Preferably, a guide member, which serves to guide the movement of the regulation plate, is provided on the inner peripheral surface of the plating tank.

The guide member allows the regulation plate to move parallel to a plating object with the distance between them kept constant. Further, by using a guide member having a recess into which a peripheral portion of the regulation plate can be inserted, leakage of electric field from the periphery of the regulation plate can be prevented.

Preferably, the regulation plate is provided with a mounting section for mounting of an auxiliary regulation plate for regulation of electric field.

The combination of the regulation plate and the auxiliary regulation plate enables the formation of an optimal electric field for the type of the plating object without changing the installation position of the regulation plate or replacing the regulation plate.

In a preferred aspect of the present invention, the plating apparatus further comprises a positioning/holding section for positioning and holding the holder, the regulation plate and an anode holder holding the anode.

The center positions of the substrate holder, the regulation plate and the anode holder in the vertical direction of the plating tank can easily be aligned by setting the positioning/holding section, holding the substrate holder, the regulation plate and the anode holder in position, in the plating tank.

According to the plating apparatus and the plating method of the present invention, when carrying out plating of a plating object (substrate) such as a semiconductor wafer, a bump having a flat top or a metal film having good in-plane uniformity can be formed even when the plating is carried out under high-current density conditions.

DETAILED DESCRIPTION OF THE PREFERRED EMBODIMENTS

Figure 1:
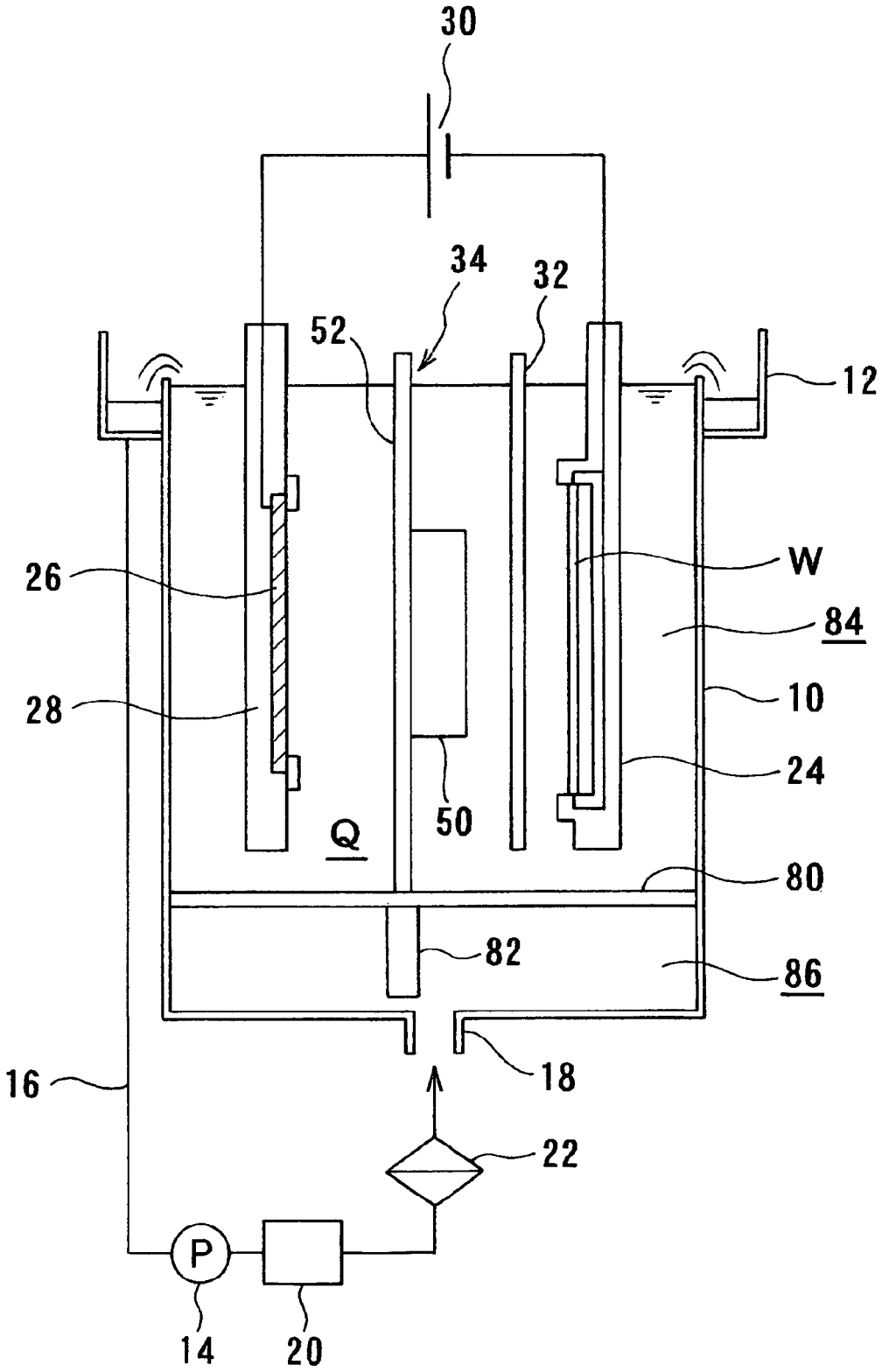
FIG. 1 is a vertical sectional front view of a plating apparatus according to an embodiment of the present invention.

Preferred embodiments of the present invention will now be described with reference to the drawings. The following description illustrates the case of carrying out copper plating on a surface of a substrate as a plating object. In the following description, the same or equivalent members are given the same reference numerals, and a duplicate description thereof will be omitted.

FIG. 1 is a vertical sectional front view of a plating apparatus according to an embodiment of the present invention. As shown in FIG. 1, the plating apparatus includes a plating tank 10 holding a plating solution Q therein. An overflow tank 12 for receiving the plating solution Q that has overflowed an edge of the plating tank 10 is provided around an upper end of the plating tank 10. One end of a plating solution supply route 16, which is provided with a pump 14, is connected to a bottom of the overflow tank 12, and the other end of the plating solution supply route 16 is connected to a plating solution supply inlet 18 provided at a bottom of the plating tank 10. The plating solution Q in the overflow tank 12 is returned into the plating tank 10 by the actuation of the pump 14. Located downstream of the pump 14, a constant-temperature unit 20 for controlling the temperature of the plating solution Q and a filter 22 for filtering out foreign matter contained in the plating solution are interposed in the plating solution supply route 16.

The plating apparatus also includes a substrate holder 24 for detachably holding a substrate (plating object) W and immersing the substrate W in a vertical position in the plating solution Q in the plating tank 10. An anode 26, held by an anode holder 28 and immersed in the plating solution Q in the plating tank 10, is disposed opposite the substrate W held by the substrate holder 24 and immersed in the plating solution Q. In this embodiment, phosphorus-containing copper is used for the anode 26. The substrate W and the anode 26 are electrically connected via a plating power source 30, and a plated film (copper film) is formed on the surface of the substrate W by passing electric current between the substrate W and the anode 26.

A paddle 32, which reciprocates parallel to the surface of the substrate W to stir the plating solution Q, is disposed between the substrate W, which is held by the substrate holder 24 and immersed in the plating solution Q, and the anode 26. By stirring the plating solution Q with the paddle 32, a sufficient amount of copper ions can be supplied uniformly to the surface of the substrate W. The distance between the paddle 32 and the substrate W is preferably 5 mm to 11 mm. Further, a regulation plate 34 of dielectric material, for making the distribution of electric potential more uniform over the entire surface of the substrate W, is disposed between the paddle 32 and the anode 26.

Figure 2:
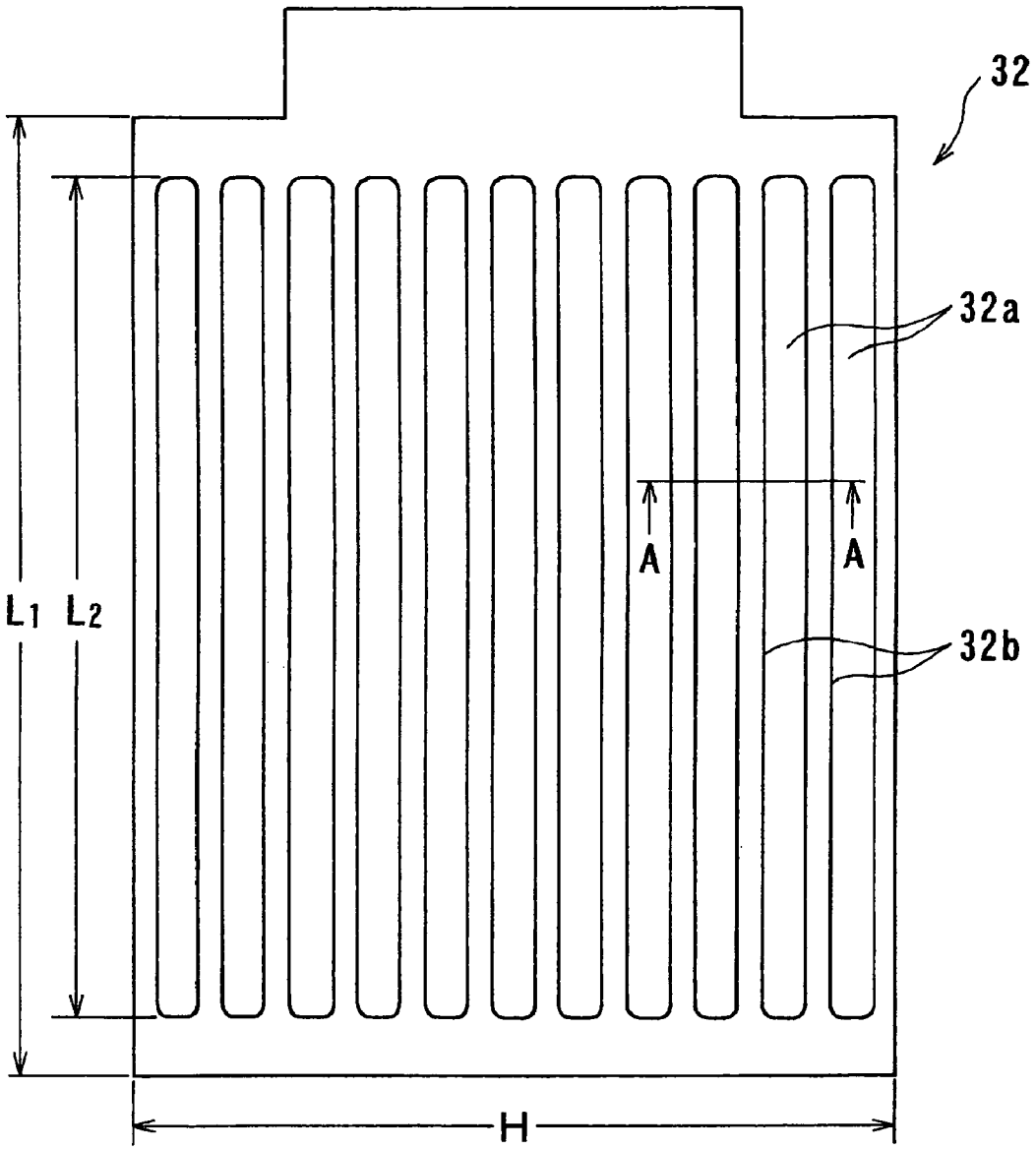
FIG. 2 is a plan view of a paddle for use in the plating apparatus shown in FIG. 1.
Figure 3:
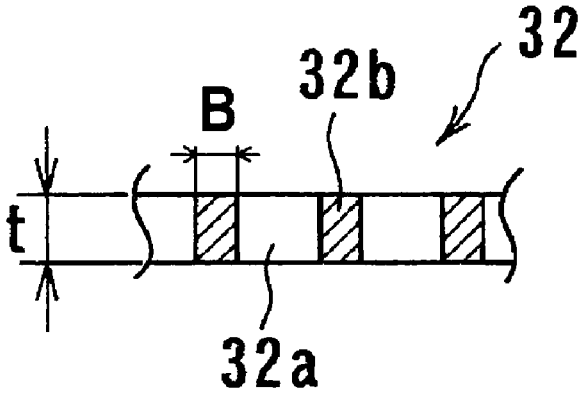
FIG. 3 is a cross-sectional view taken along line A-A of FIG. 2.

As shown in FIGS. 2 and 3, the paddle 32 is comprised of a rectangular plate-like member having a uniform thickness "t" of 3 mm to 5 mm, and has a plurality of parallel slits 32a that define vertically-extending strip-like portions 32b. The paddle 32 is formed of, for example, titanium with a Teflon coating. The vertical length $L_1$ of the paddle 32 and the vertical length $L_2$ of the slits 32a are sufficiently larger than the vertical size of the substrate W. Further, the paddle 32 is so designed that the sum of its lateral length H and its reciprocation distance (stroke "St") is sufficiently larger than the lateral size of the substrate W.

It is preferred that the width and the number of the slits 32a be determined such that each strip-shaped portion 32b is as narrow as possible insofar as it has the necessary rigidity so that the strip-shaped portions 32b between the slits 32a can efficiently stir the plating solution and, in addition, the plating solution can efficiently pass through the slits 32a. Narrowing the strip-shaped portions 32b of the paddle 32 is important also in order to reduce the formation of a shadow of electric field (a spot not or little affected by electric field) on the substrate W when the paddle 32 slows down near the ends (stroke ends) of its reciprocation or makes a momentary stop.

Figure 4A:
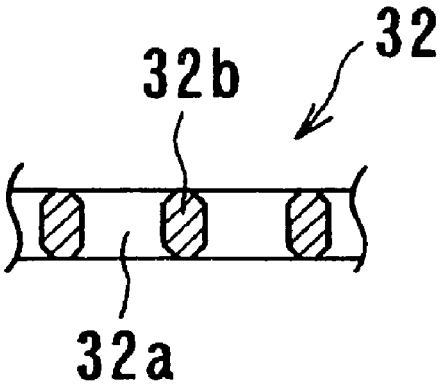
FIGS. 4A and 4B are diagrams each corresponding to FIG. 3, showing variations of the paddle.
Figure 4B:
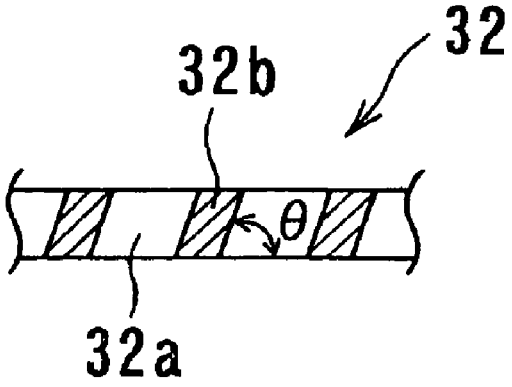

In this embodiment, as shown in FIG. 3, the slits 32a are formed vertically such that each strip-shaped portion 32b has a rectangular cross section. A width "B" of each strip-shaped portion 32b is preferably 2 mm to 8 mm, more preferably 3 mm to 6 mm. As shown in FIG. 4A, each strip-shaped portion 32b may be chamfered at the four corners in its cross section or, as shown in FIG. 4B. Alternatively, each strip-shaped portion 32b may have a parallelogram cross-sectional shape so that it is inclined at a predetermined angle θ to a vertical plane parallel to the substrate W. The inclined angle θ of the strip-shaped portion 32b to a vertical plane parallel to the substrate W is preferably 30° to 60°, more preferably 40° to 50°. With this structure, paddling effect of the plating solution with the paddle 32 can be enhanced.

The thickness (plate thickness) "t" of the paddle 32 is preferably 3 mm to 5 mm, and 4 mm in this embodiment, in order that the regulation plate 34 can be disposed near the substrate W. It has been confirmed that if the thickness (plate thickness) "t" of the paddle 32 is 1 mm or 2 mm, the paddle 32 does not have a sufficient strength. By making the thickness of the paddle 32 uniform, spattering or large waving of the plating solution can be prevented.

Figure 5:
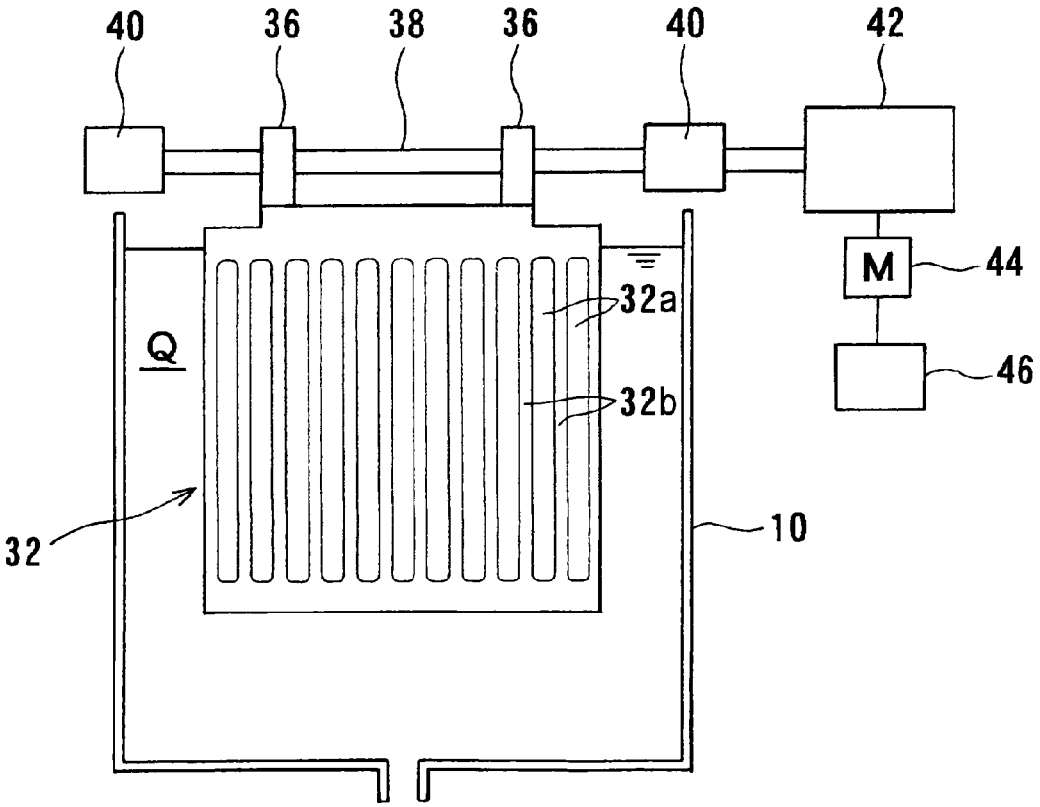
FIG. 5 is a schematic diagram showing a paddle drive mechanism of the plating apparatus shown in FIG. 1 together with the plating tank.

FIG. 5 shows a drive mechanism for the paddle 32 together with the plating tank 10. The paddle 32 is secured to a horizontally-extending shaft 38 by clamps 36 fixed to the upper end of the paddle 32. The shaft 38 is held by shaft holders 40 and can slide horizontally. The end of the shaft 38 is coupled to a paddle drive section 42 for reciprocating the paddle 32 linearly and horizontally. The paddle drive section 42 converts the rotation of a motor 44 into the linear reciprocating movement of the shaft 38 by a crank mechanism (not shown). In this embodiment, a control section 46, which controls the movement velocity of the paddle 32 by controlling the rotational speed of the motor 44 of the paddle drive section 42, is provided. Instead of the paddle drive section 42 which uses the crank mechanism, it is also possible to use a paddle drive section which converts the rotation of a servo motor into the linear reciprocating movement of a shaft by means of a ball screw, or a paddle drive section which linearly reciprocates a shaft by means of a linear motor.

Figure 6:
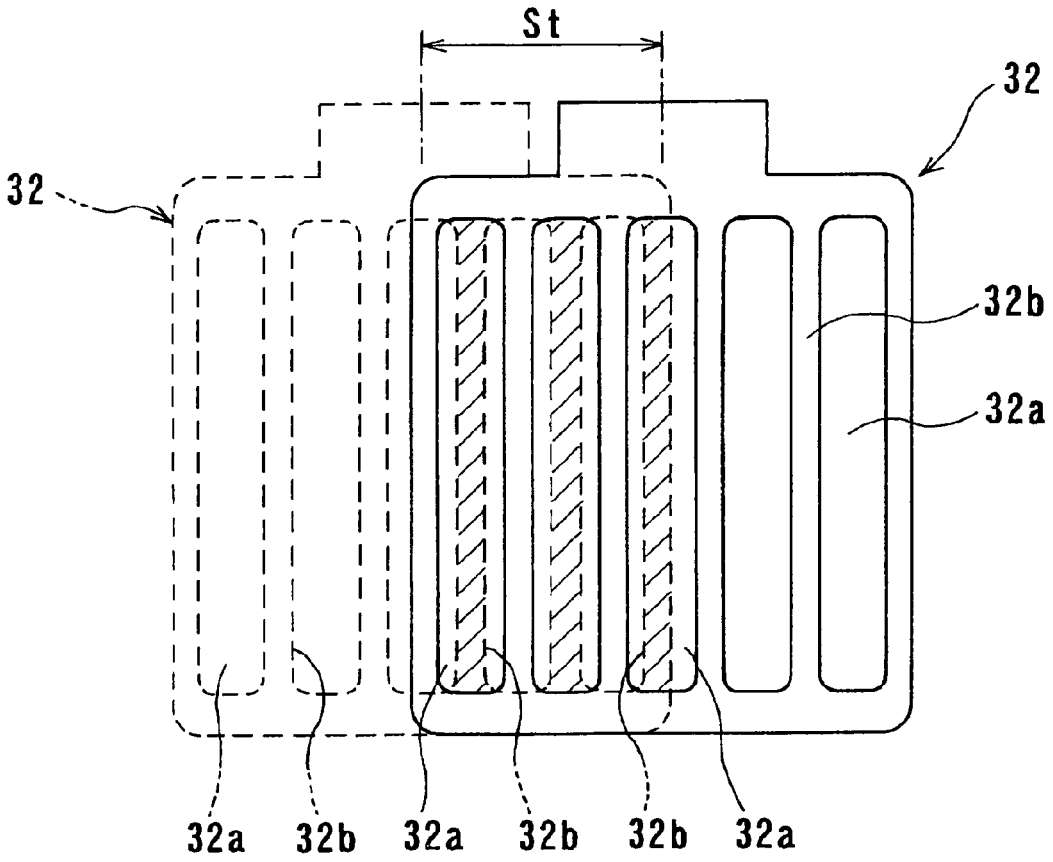
FIG. 6 is a plan view illustrating the stroke end of the paddle.

In this embodiment, as shown in FIG. 6, the paddle 32 is reciprocated with such a stroke "St" that the strip-shaped portions 32b of the paddle 32 positioned at one stroke end do not overlap the strip-shaped portions 32b of the paddle 32 positioned at the other stroke end. This can reduce the influence of the paddle 32 on the formation of a shadow of electric field on the substrate W.

In this embodiment, the paddle 32 is reciprocated at a higher velocity than conventional one, in particular at a velocity whose average absolute value is 70 cm/sec to 100 cm/sec. This is based on the finding by the present inventors of the experimental fact that when plating for the formation of bumps is carried out at a current density of 8 ASD ($A/dm^2$), which is higher than a conventional current density of 5 ASD, bumps having a flat top can be formed by stirring a plating solution with a paddle moving at a higher velocity than conventional one, in particular at a velocity whose average absolute value is 70 cm/sec to 100 cm/sec. In this embodiment, the rotational movement of the motor 44 is converted by the crank mechanism into the linear reciprocating movement of the paddle 32, as described above; and one revolution of the motor 44 causes one reciprocation of the paddle 32 with a stroke "St" of 10 cm. In this embodiment, optimal bumps can be formed when the motor 44 is rotated at 250 rpm. Thus, the optimal average absolute value of the movement velocity of the paddle 32 is 83 cm/sec.

Figure 7:
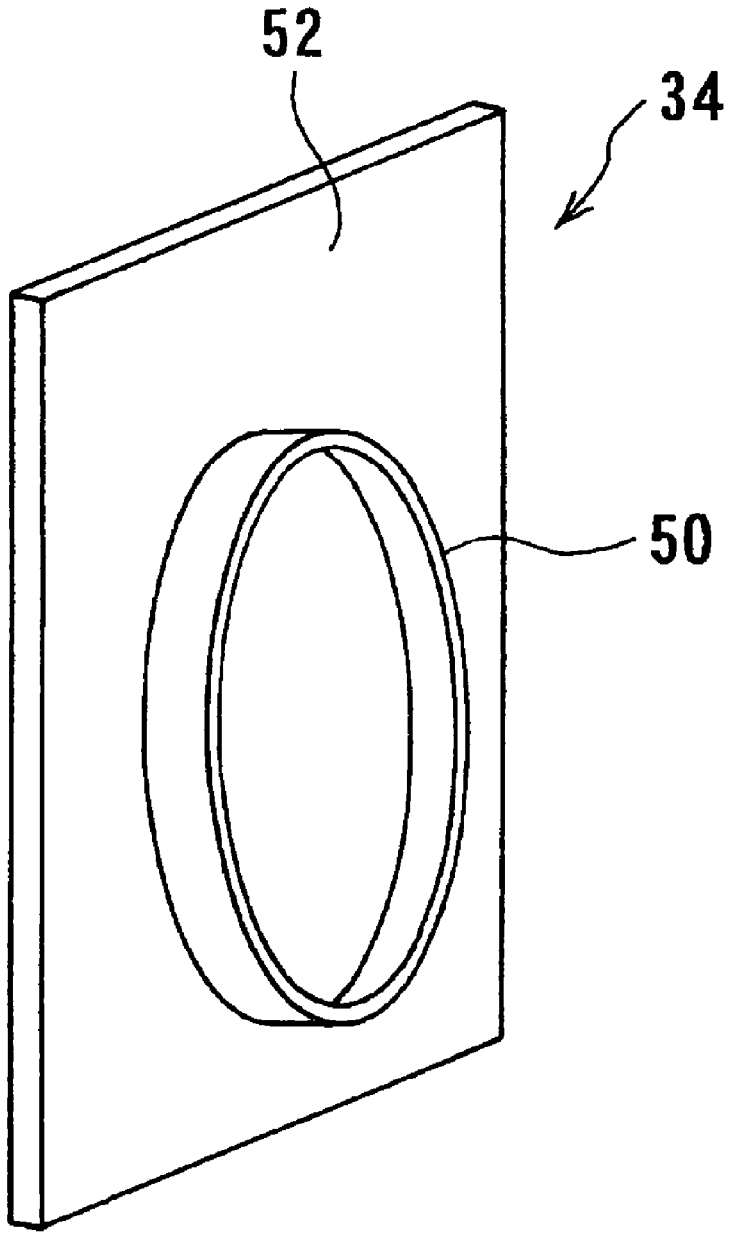
FIG. 7 is a perspective view of a regulation plate for use in the plating apparatus shown in FIG. 1.

FIG. 7 shows an outline drawing of the regulation plate 34 shown in FIG. 1. The regulation plate 34 is comprised of a cylindrical portion 50 and a rectangular flange portion 52, and is made of polyvinyl chloride which is a dielectric material. The regulation plate 34 is installed in the plating tank 10 with the front end of the cylindrical portion 50 positioned on the substrate side and the flange portion 52 positioned on the anode side. The cylindrical portion 50 has such an opening size and axial length as to sufficiently restrict broadening of the electric field. In this embodiment, the axial length of the cylindrical portion is 20 mm. The flange portion 52 is disposed in the plating tank 10 so that it blocks the electric field formed between the anode 26 and the substrate W. Referring to FIG. 1, the distance between the cylindrical portion 50 of the regulation plate 34 and the substrate W is preferably 8 mm to 25 mm, more preferably 12 mm to 18 mm.

Figure 8:
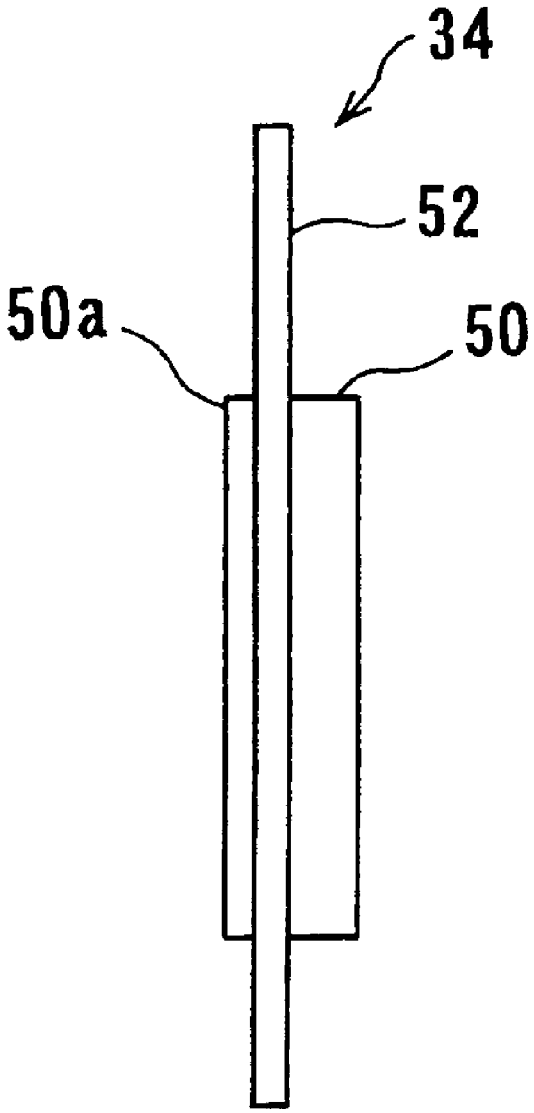
FIG. 8 is a side view showing another regulation plate.

Though in the regulation plate 34 of this embodiment, the flange portion 52 is attached to the end of the cylindrical portion 50, as shown in FIG. 7, it is also possible to extend the cylindrical portion 50 toward the anode such that a portion 50a of the cylindrical portion 50 projects from the anode-side surface of the flange portion 52, as shown in FIG. 8.

As shown in FIG. 1, the substrate W is held by the substrate holder 24. The substrate holder 24 is designed to be capable of feeding electricity to a peripheral area of the substrate W having a surface conductive film, such as a sputtered copper film. The substrate holder 24 has multiple electrical contacts whose total width is not less than 60% of the circumferential length of the peripheral area of the substrate with which the electrical contacts can make contact. The electrical contacts are evenly distributed at equal intervals.

Because the paddle 32 is moved at a high velocity, e.g., at a velocity whose average absolute value is 70 cm/sec to 100 cm/sec, in this embodiment, the substrate holder 24 will receive a backward pressure from the flow of the plating solution. This can bring about problems, such as swinging or tilting of the substrate holder 24. Swinging or tilting of the substrate holder 24 will make the potential distribution non-uniform and thus adversely affect the in-plane uniformity of a plated film.

Figure 9:
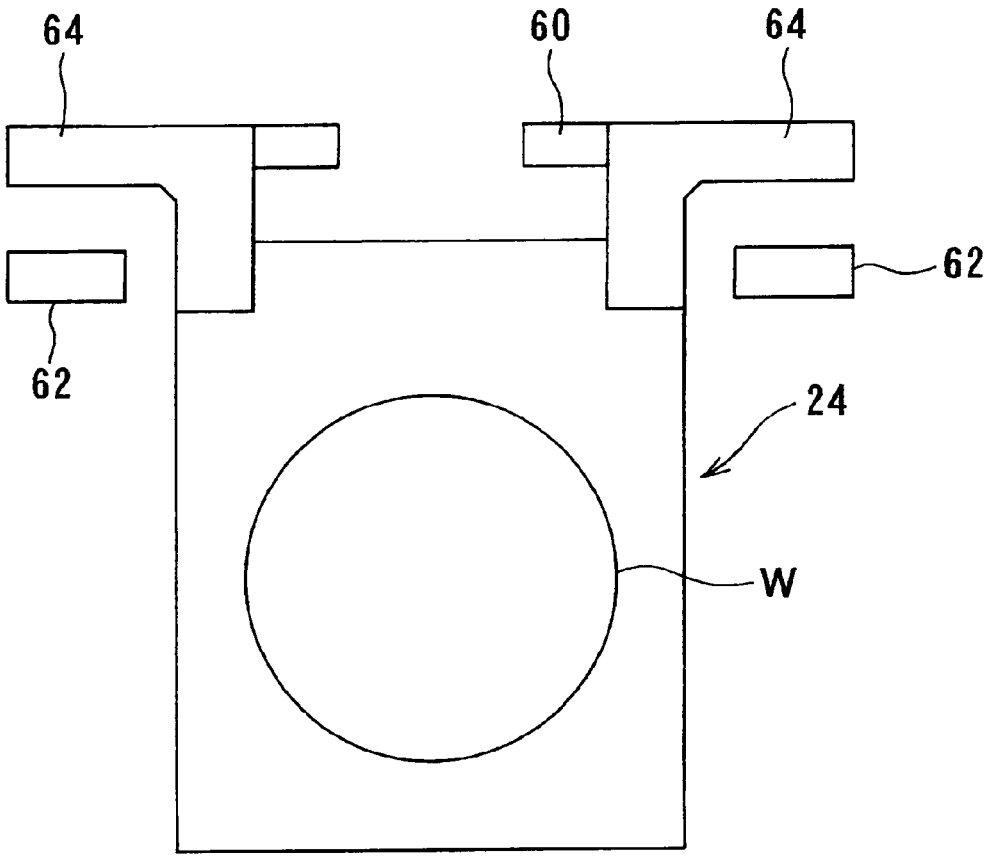
FIG. 9 is a diagram illustrating the relationship between a substrate holder of the plating apparatus shown in FIG. 1 and a holder support of the plating tank.

As shown in FIG. 9, the substrate holder 24, when it is set in the plating tank 10, is hung on a not-shown transporter with holder grips 60 gripped by the transporter, and then hung and supported on holder supports 62, fixed on the plating tank 10, with outwardly-projecting holder arms 64 caught on the holder supports 62.

Figure 10:
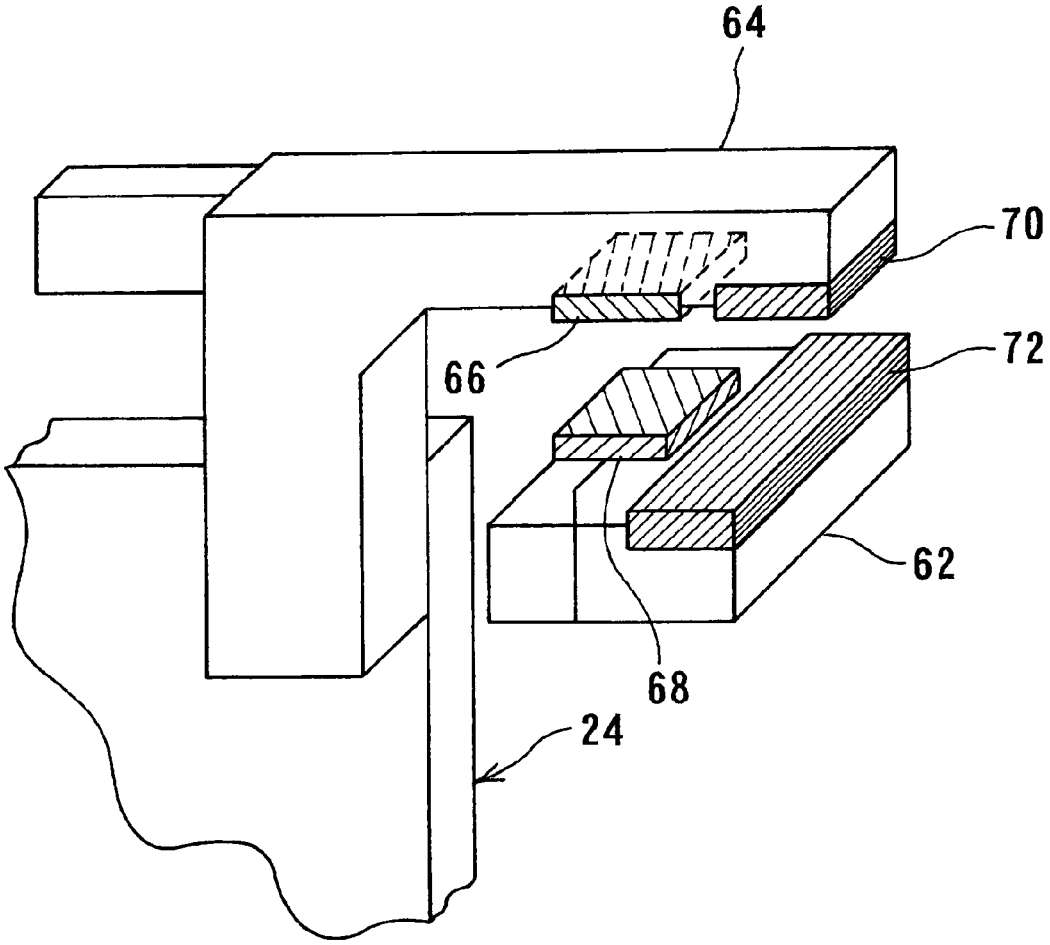
FIG. 10 is an enlarged perspective view showing a holder arm and its vicinity in the plating apparatus shown in FIG. 1.
Figure 11:
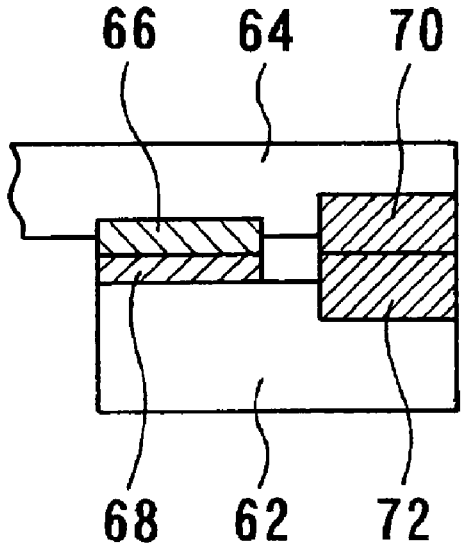
FIG. 11 is a cross-sectional diagram illustrating the holder arm and the holder support when they are in contact.
Figure 12:
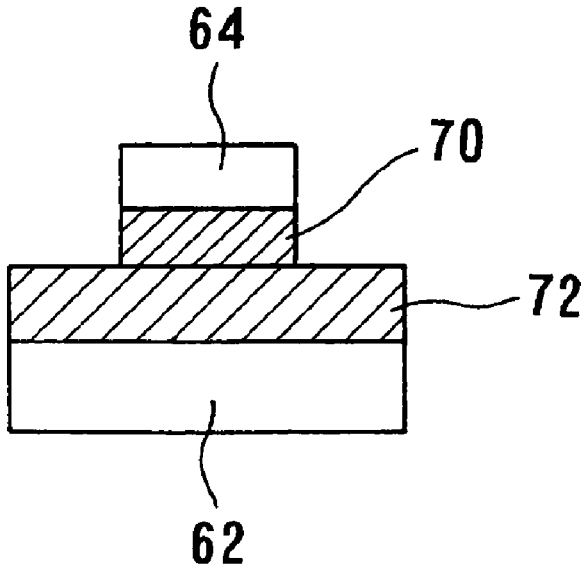
FIG. 12 is a right side view of FIG. 11.

FIG. 10 is an enlarged perspective view showing the holder arm 64 and its vicinity, FIG. 11 is a cross-sectional diagram illustrating the holder arm 64 and the holder support 62 when they are in contact, and FIG. 12 is a right side view of FIG. 11. As shown in FIGS. 10 through 12, an arm-side contact 66 is provided in that surface of the holder arm 64 which faces the holder support 62. The arm-side contact 66 is electrically connected by not-shown conducting wires to cathode contacts for feeding electricity to the substrate W. On the other hand, a support-side contact 68 is provided in that surface of the holder support 62 which faces the holder arm 64. The support-side contact 68 is electrically connected to a not-shown external power source. When the substrate holder 24 is hung and supported on the plating tank 10, the arm-side contact 66 and the support-side contact 68 come into contact with each other and close, whereby the external power source and the cathode contacts become electrically connected. A cathode voltage can thus be applied to the cathode contacts. Usually, the arm-side contact 66 and the support-side contact 68 are provided in one of the right and left holder arms 64 and the corresponding one of the right and left holder supports 62, respectively.

An arm-side magnet 70, as a fixing member, is provided in that surface of the holder arm 64 which faces the holder support 62, while a support-side magnet 72, as a fixing member, is provided in that surface of the holder support 62 which faces the holder arm 64. Neodymium magnets, for example, may be used as the magnets 70, 72. With this structure, when the substrate holder 24 is hung and supported on the plating tank 10, the arm-side magnet 70 and the support-side magnet 72 come into contact and attract each other, whereby the substrate holder 24 is more firmly fixed to the plating tank 10 via the substrate support 62 and the holder arm 64. Swinging or tilting of the substrate holder 24 due to the flow of plating solution can therefore be prevented. Usually, the arm-side magnet 70 and the support-side magnet 72 are provided in both of the right and left holder arms 64 and both of the right and left holder supports 62.

Figure 13:
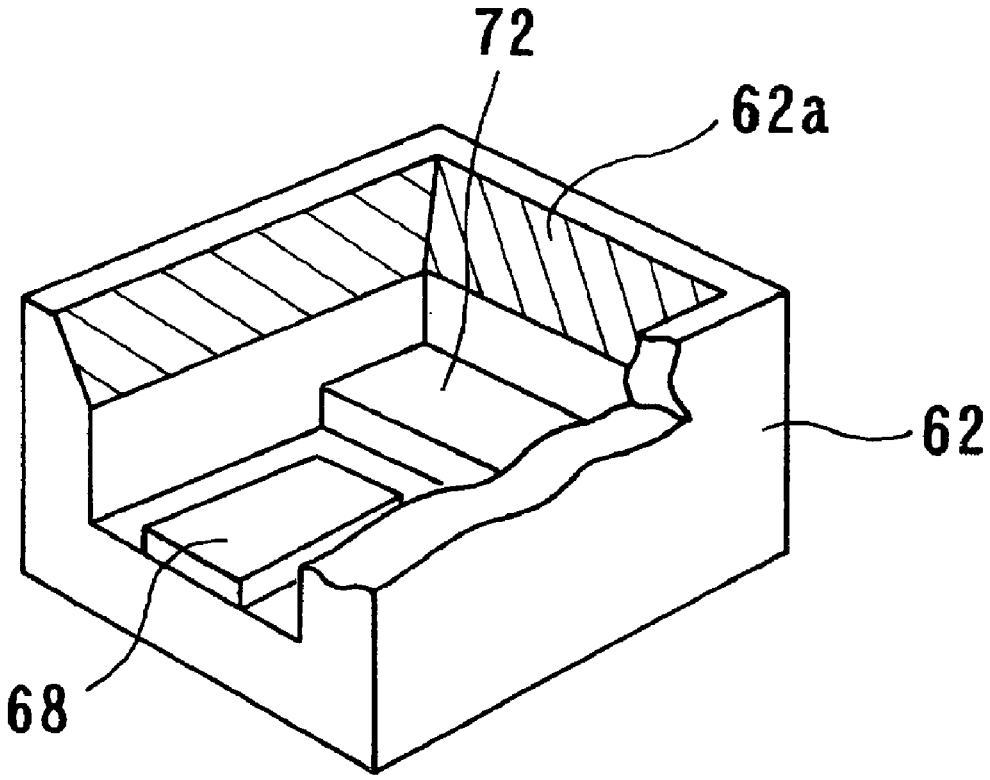
FIG. 13 is a perspective view of another holder support.

Positioning of the substrate holder 24 with respect to the plating tank 10 is made by transport of a transporter. As shown in FIG. 13, it is also possible to provide a channel-like opening 62a, having tapered surfaces in the top, in the holder support 62, and use the opening 62a as a guide for the holder arm 64 of the substrate holder 24. When the opening (guide) 62a is provided in the substrate support 62 for positioning of the substrate holder 24 with respect to the plating tank 10, a small dimensional "play" of the opening 62a is needed for positioning and transport of the substrate holder 24. It is possible that, when the substrate holder 24 swings or tilts within the range of the "play", permanent or intermittent disconnection between the arm-side contact 66 and the support-side contact 68 may occur. In this regard, contact between the arm-side contact 66 and the support-side contact 68 can be made firm by firmly supporting the substrate holder 24 on the plating tank 10 by the magnets 70, 72 in the vicinity of the contacts 66, 68. Further, wear of the contacts 66, 68 caused by their friction can be suppressed, and endurance of the contacts 66, 68 can be enhanced.

One of the arm-side magnet 70 and the support-side magnet 72 may be replaced with a magnetic material. It is also possible to cover a magnet with a magnetic material to prevent damage to the magnet by its contact. Further, it is possible to cover the periphery of a magnet with a magnetic material such that the surface of the magnet is exposed and part of the magnetic material projects from the magnet surface, thereby increasing the magnetic force.

As shown in FIG. 1, a separation plate 80 and a shield plate 82 are installed in the bottom of the plating tank 10. In order for the plating solution Q, supplied from the plating solution supply inlet 18 provided at the bottom of the plating tank 10, to form a uniform flow over the entire surface of the substrate W, a space for distribution of the plating solution is provided in the bottom of the plating tank 10 and the separation plate 80, having a large number of plating solution passage holes, is disposed in a horizontal position in the space. The interior of the plating tank 10 is thus separated by the separation plate 10 into an upper substrate processing chamber 84 and a lower plating solution distribution chamber 86.

Figure 14:
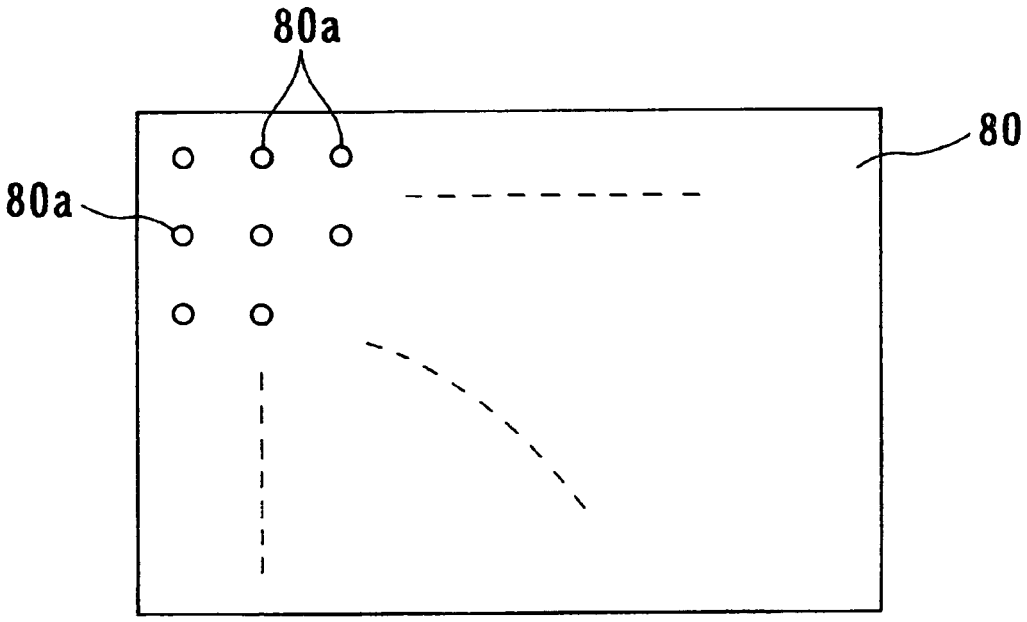
FIG. 14 is a plan view of a separation plate for use in the plating apparatus shown in FIG. 1.

FIG. 14 shows a plan view of the separation plate 80. The separation plate 80 has substantially the same shape as the inner shape of the plating tank 10 and has a large number of small plating solution passage holes 80a all over the plate. By separating the plating tank 10 by the separation plate 80 into the substrate processing chamber 84 and the plating solution distribution chamber 86, and providing the separation plate 80 having the plating solution passage holes 80a for passage of plating solution, the plating solution Q is allowed to form a uniform flow toward the substrate W. If the plating solution passage holes 80a provided in the separation plate 80 have a large diameter, the electric field from the anode 26 will pass through the plating solution distribution chamber 86 and leak into the substrate W side, which will affect the in-plane uniformity of a plated film formed on the substrate W. The plating solution passage holes 80a used in this embodiment, therefore, have a small diameter of 2.5 mm.

Figure 15:
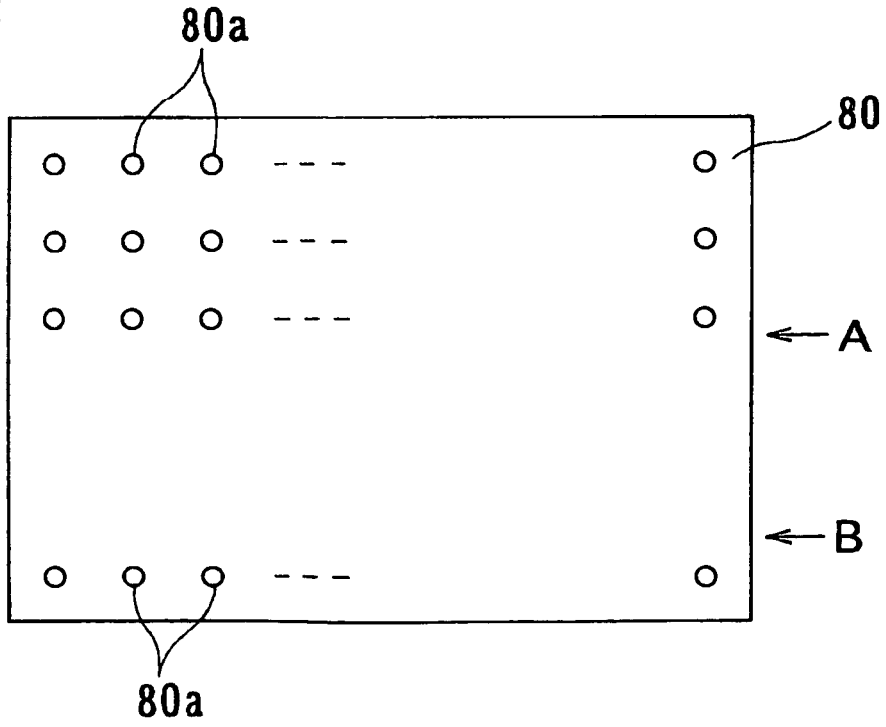
FIG. 15 is a plan view of a variation of the separation plate.

Though, in this embodiment, the plating solution passage holes 80a are provided all over the separation plate 80, the holes 80a may not necessarily be provided all over the plate. For example, as shown in FIG. 15, it is possible to provide distributed plating solution passage holes 80a in the substrate side area with the position A of the regulation plate 34 as a boundary, and also provide plating solution passage holes 80a in the opposite area (behind the anode) with the position B of the anode 26 as a boundary. The use of the separation plate 80 shown in FIG. 15 can more effectively prevent the electric field from the anode 26 from passing through the plating solution distribution chamber 86 and leaking into the substrate W side. Furthermore, with the plating solution passage holes 80a also provided behind the anode 26, the plating solution Q can be securely discharged from the plating tank 10.

Figure 16:
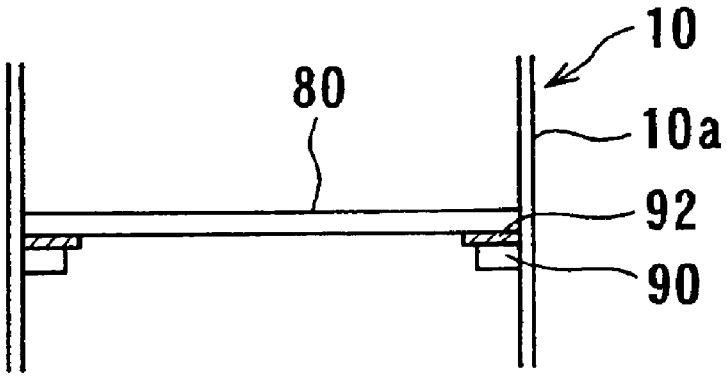
FIG. 16 is a cross-sectional diagram illustrating installation of the separation plate on a side plate of the plating tank in the plating apparatus shown in FIG. 1.

As shown in FIG. 16, the separation plate 80 is supported in a horizontal position on a separation plate support 90 provided on a side plate 10a of the plating tank 10. The separation plate 80 can be brought into firm contact with the separation plate support 90 by providing a packing 92 therebetween.

Figure 17:
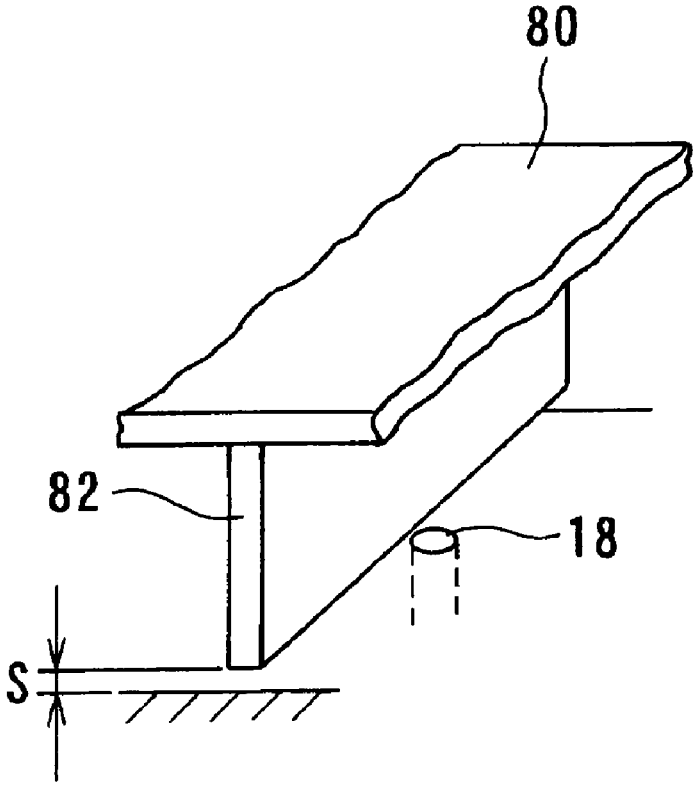
FIG. 17 is a perspective view illustrating a relationship between the separation plate, a shield plate and a bottom of the plating tank in the plating apparatus shown in FIG. 1.

Despite the use of the separation plate 80, the electric field from the anode 26 can pass through the plating solution distribution chamber 86 and leak into the substrate W side, affecting the in-plane uniformity of a plated film formed on the substrate W. In this embodiment, therefore, the shield plate 82, extending vertically downward, is mounted to the lower surface of the separation plate 80. The provision of the shield plate 82 can more effectively prevent the electric field from the anode 26 from passing through the plating solution distribution chamber 86 and leaking into the substrate W side while ensuring distribution of the plating solution Q in the plating solution distribution chamber 86 and the formation of a uniform flow of the plating solution Q into the substrate processing chamber 84. In this regard, as shown in FIG. 17, the shield plate 82 is mounted to the lower surface of the separation plate 80 in such a manner that the shield plate 82 is positioned right above the plating solution supply inlet 18 and a gap "S" is formed between the shield plate 82 and the bottom of the plating tank 10. In order to prevent leakage of electric field, the gap "S" is preferably as small as possible.

Figure 18:
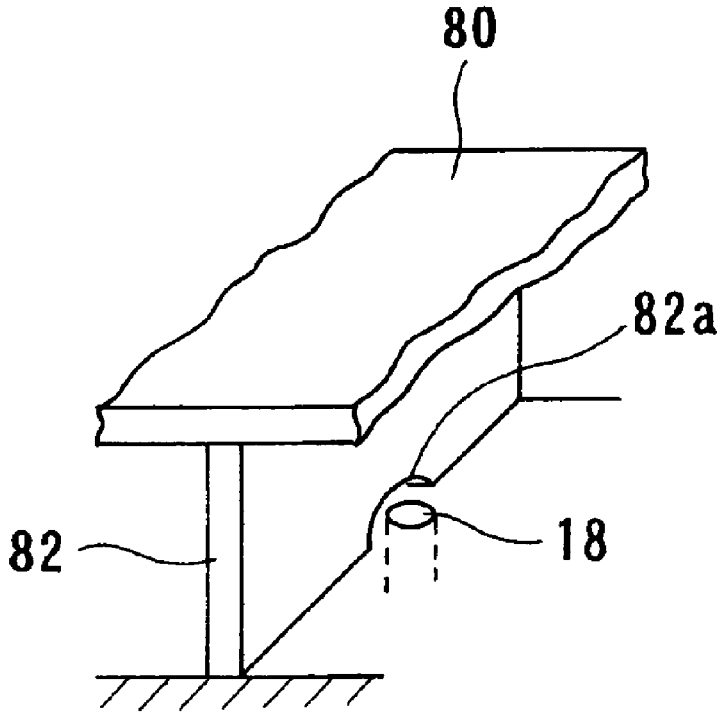
FIG. 18 is a perspective view illustrating another relationship between the separation plate, a shield plate and the bottom of the plating tank.

As shown in FIG. 18, it is also possible to dispose the shield plate 82 in contact with the bottom of the plating tank 10 and provide a semicircular opening 82a in the shield plate 82 so as to secure a flow passage for the plating solution. Also in this case, the opening 82a is preferably as small as possible to prevent leakage of electric field. The shield plate 82 is disposed on that area of the lower surface of the separation plate 80 in which the plating solution passage holes 80a are not present, for example, the area which lies right under the flange portion 52 of the regulation plate 34.

Though, in this embodiment, the shield plate 82 is disposed right above the plating solution supply inlet 18, the shield plate 82 need not necessarily be disposed right above the plating solution supply inlet 18. Further, it is also possible to use a plurality of shield plates 82.

In the plating apparatus shown in FIG. 1, the positional relationship between the substrate W, the anode 26, the regulation plate 34 and the paddle 32 in the plating tank 10 affects the in-plane uniformity of a plated film formed on the substrate W. In this embodiment, the substrate W, the anode 26 and the regulation plate 34 are disposed such that the center of the substrate W, the center of the anode 26 and the axis of the cylindrical portion 50 of the regulation plate 34 substantially align. The pole-to-pole distance between the anode 26 and the substrate W is 90 mm in this embodiment; and the pole-to pole distance can be set generally in the range of 60 mm to 95 mm. In this embodiment, the distance between the substrate W and the substrate W-side end of the cylindrical portion 50 of the regulation plate 34 is 15 mm and the length of the cylindrical portion 50 is 20 mm, and therefore the distance between the substrate W and the flange portion 52 of the regulation plate 34 is 35 mm.

Figure 19:
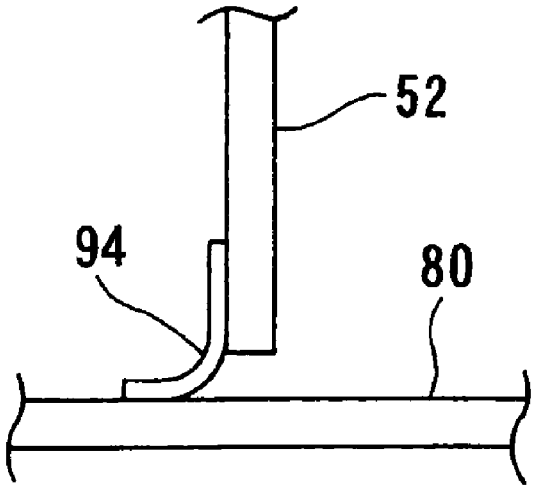
FIG. 19 is a cross-sectional diagram illustrating the relationship between a flange portion of the regulation plate and the separation plate in the plating apparatus shown in FIG. 1.

As shown in FIG. 19, an electric field-shielding member 94 of, e.g., a rubber sheet, whose lower end is in elastic contact with the separation plate 80, is provided at the anode-side lower end of the flange portion 52 of the regulation plate 34. The electric field-shielding member 94 can prevent leakage of electric current from the gap between the separation plate 80 and the flange portion 52. It is also possible to make the lower surface of the flange portion 52 in close contact with the upper surface of the separation plate 80 so that the flange portion 52 can also serve as an electric field-shielding member.

Figure 20:
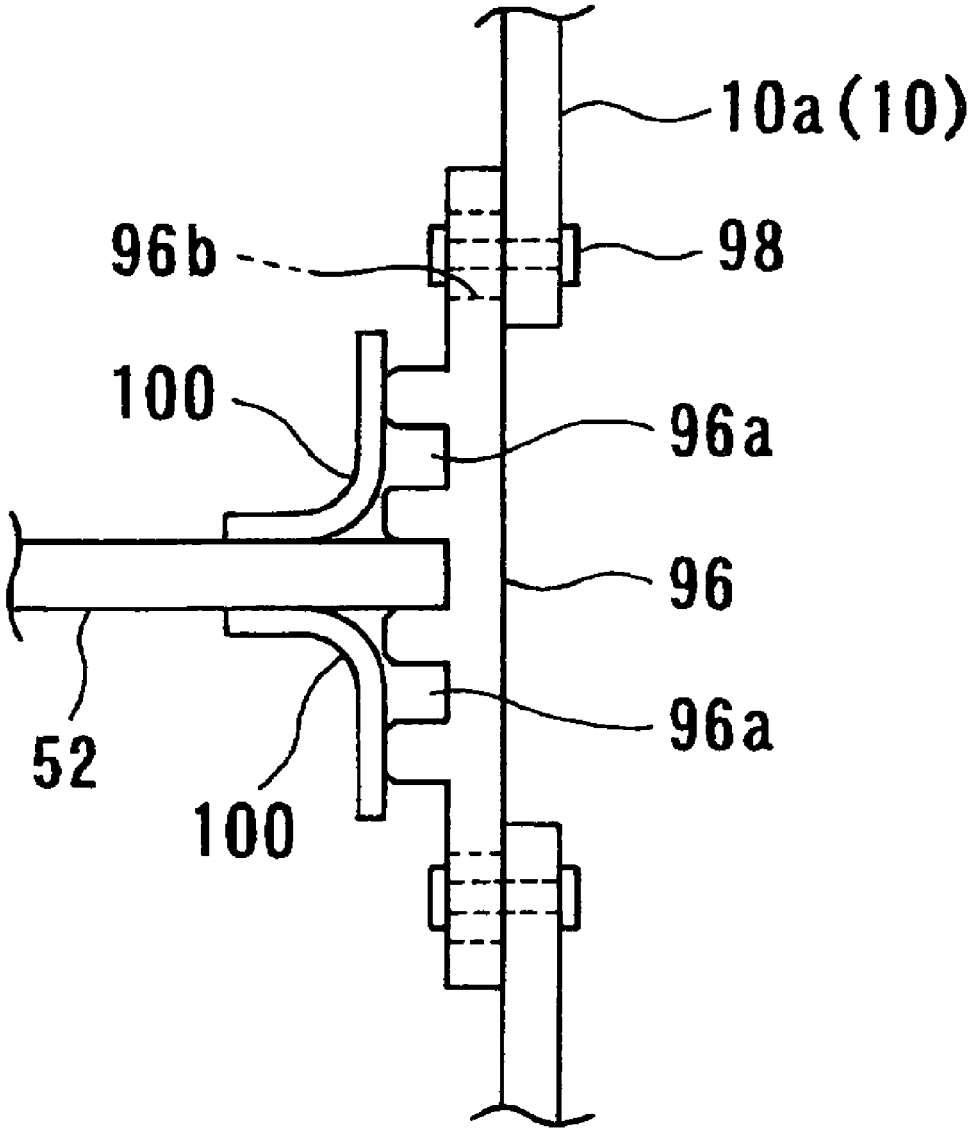
FIG. 20 is a diagram, as viewed from above the plating tank, illustrating an embodiment in which the regulation plate is mounted to the plating tank in such a manner that the distance between the regulation plate and a substrate is adjustable.

The regulation plate 34 may be mounted to the plating tank 10 in such a manner that the distance between the regulation plate 34 and the substrate W is adjustable. In particular, as shown in FIG. 20, it is possible to provide a regulation plate-fixing slitted plate 96, having a plurality of vertical slits 96a arranged at a predetermined pitch, on the side plate 10a of the plating tank 10, and insert each side end of the flange portion 52 of the regulation plate 34 into an arbitrary slit 96a of the regulation plate-fixing slitted plate 96. The regulation plate-fixing slitted plate 96 can be mounted to the plating tank side plate 10a by means of slits 96b and fixing screws 98. This mounting method makes it possible to finely adjust the distance between the regulation plate 34 and the substrate W so as to position the regulation plate 34 at the optimal position for the type of the substrate.

It is preferred to provide a pair of electric field-shielding members 100 of a rubber seal in the flange portion 52 in the vicinity of the regulation plate-fixing slitted plate 96 so as to prevent the formation of an electric field directed from the anode 26 toward the substrate W, passing through the gap between each side end of the flange portion 52 and the slit 96a. The electric field-shielding member 100 may be provided only on the anode side of the regulation plate-fixing slitted plate 96.

In the plating apparatus of the present invention, a typical diameter of bumps formed on a substrate is 150 μm and a target plating thickness is 110 μm. In order to form such bumps, it is desirable to use a plating solution having a copper sulfate concentration of not less than 150 g/L. An exemplary plating solution comprises a base solution having the following composition and contains organic additives, specifically a polymer component (suppressor), a carrier component (accelerator) and a leveler component (suppressor):

Composition of Base Solution

Copper sulfate pentahydrate ($CuSO_4.5H_2O$): 200 g/L

Sulfuric acid ($H_2SO_4$): 100 g/L

Chlorine (Cl): 60 mg/L

While plating for the formation of bumps by a conventional common plating method is carried out at a current density of 3 ASD to 5 ASD, plating according to the present invention is carried out, e.g., at a current density of 8 ASD. The plating apparatus and plating method according to the present invention is applicable to plating at a current density up to 14 ASD. In the following description, plating operations are carried out at a current density of 8 ASD unless otherwise specified.

Figure 21:
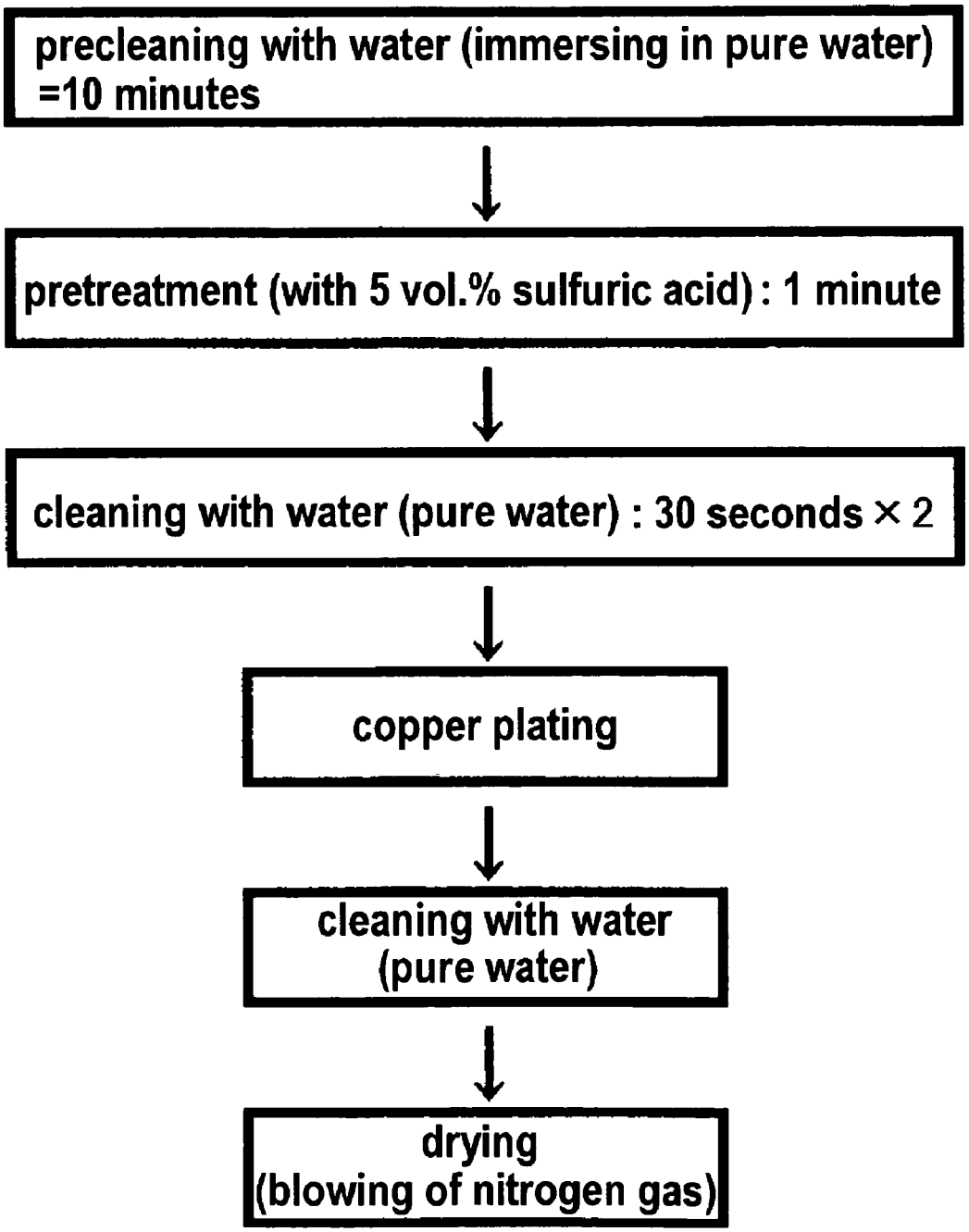
FIG. 21 is a flow chart of a copper plating process for the formation of bumps.

FIG. 21 shows a copper plating process for the formation of bumps. First, precleaning with water of a substrate is carried by immersing the substrate in pure water, e.g., for 10 minutes. Next, pretreatment of the substrate is carried out by immersing the substrate in 5 vol. % sulfuric acid, e.g., for 1 minute. Cleaning of the substrate with pure water is then carried out, e.g., for 30 seconds. The cleaning with pure water is carried out twice. Thereafter, copper plating of the substrate is carried out by first immersing the substrate in a plating solution for 1 minute without application of electric current, and then applying an electric current to the plating system. The substrate after plating is cleaned with pure water, and then the substrate is dried, e.g., by blowing nitrogen gas. After the plating process, a resist is stripped off the substrate with a resist-stripping solution, followed by water cleaning and drying.

Figure 22:
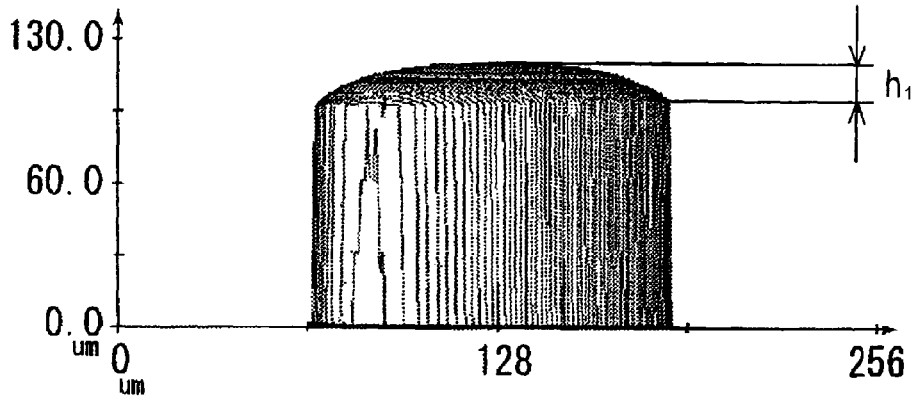
FIG. 22 is a diagram illustrating the shape of a bump formed by plating as carried out at a current density of 8 ASD while stirring a plating solution by moving a paddle at a velocity whose average absolute value is 20 cm/sec.
Figure 23:
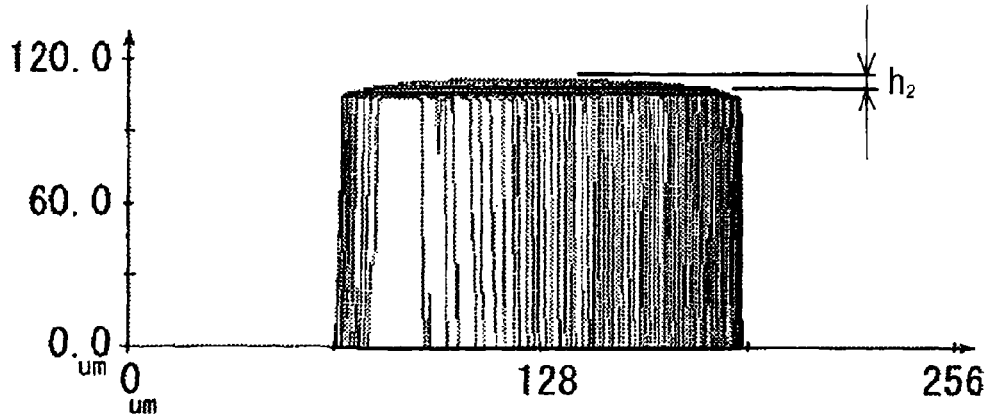
FIG. 23 is a diagram illustrating the shape of a bump formed by plating as carried out at a current density of 8 ASD while stirring a plating solution by moving the paddle at a velocity whose average absolute value is 83 cm/sec.

FIGS. 22 and 23 show different shapes of bumps formed by different plating methods which use the same current density of 8 ASD, but use different movement velocities of a paddle for stirring of a plating solution. In particular, FIG. 22 illustrates the shape of a bump formed by plating as carried out while stirring the plating solution by moving the paddle at a velocity whose average absolute value is 20 cm/sec, which is a conventional common velocity, and FIG. 23 illustrates the shape of a bump formed by plating as carried out while stirring the plating solution by moving the paddle at a velocity whose average absolute value is 83 cm/sec. As shown in FIG. 22, the height $h_1$ of the top convex portion of the bump, formed by plating carried out at a high current density of 8 ASD while stirring the plating solution with the paddle moving at the conventional low velocity, is 30 μm, whereas as shown in FIG. 23, in the case of the bump formed by plating carried out at the same high current density but with the use of the considerably higher movement velocity of the paddle at a velocity whose average absolute value is 83 cm/sec, the height of the top convex portion $h_2$ is 15 μm, which is considerably lower than the conventional bump.

Figure 24:
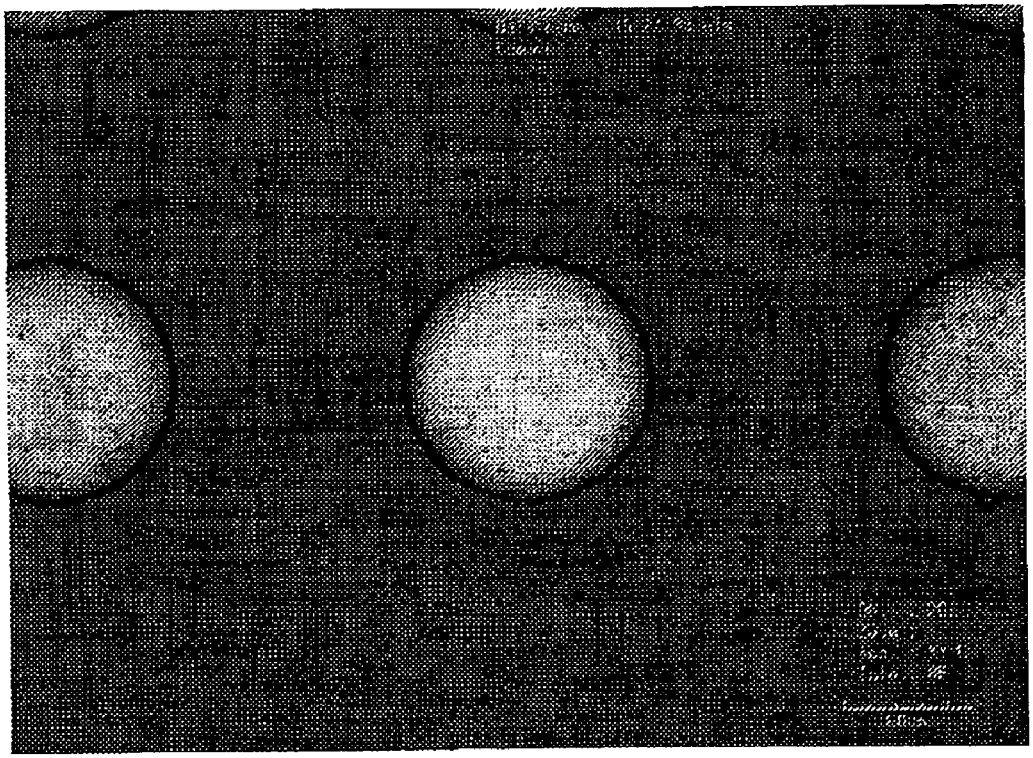
FIG. 24 is a photomicrograph of bumps formed by plating as carried out while stirring a plating solution by moving a paddle, having a thickness of 2 mm, at a velocity whose average absolute value is 40 cm/sec.
Figure 25:
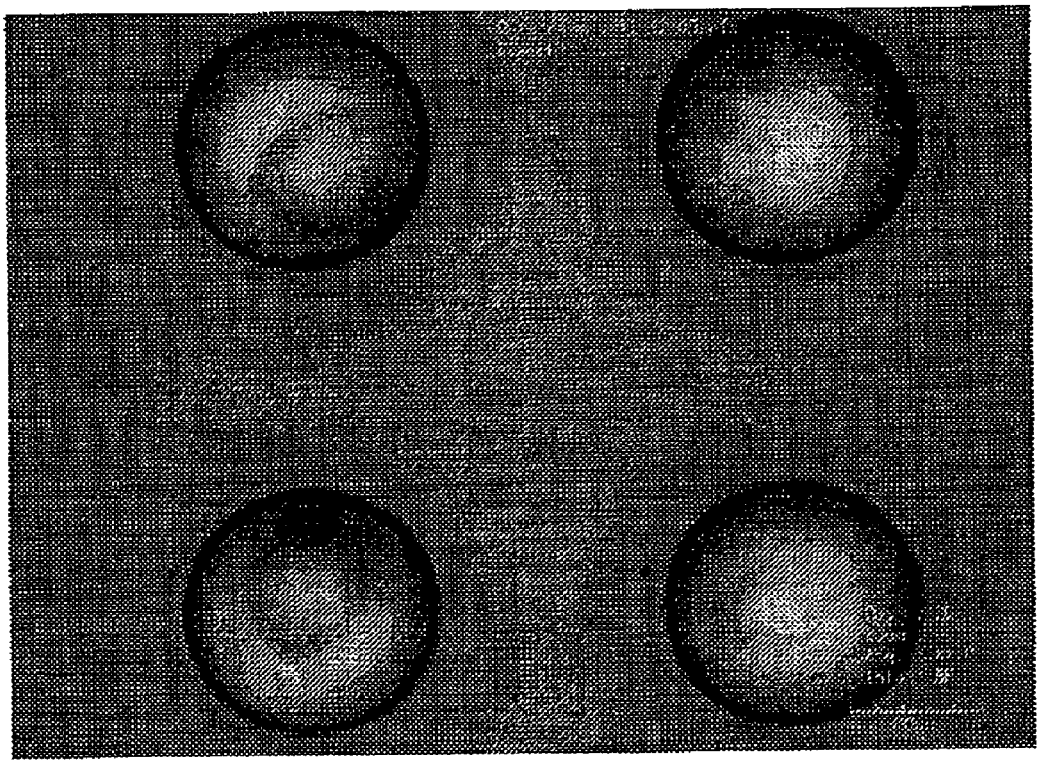
FIG. 25 is a photomicrograph of bumps formed by plating as carried out while stirring a plating solution by moving a paddle, having a thickness of 4 mm, at a velocity whose average absolute value is 40 cm/sec.

FIGS. 24 through 28 show microphotographs of bumps formed on a substrate (wafer) by plating methods which use a plating apparatus basically having the same construction as the plating apparatus shown in FIG. 1, and use various paddles and their various movement velocities for stirring of a plating solution. In particular, FIG. 24 shows bumps formed by plating as carried out while stirring the plating solution by moving a paddle, having a thickness of 2 mm, at a velocity whose average absolute value is 40 cm/sec. Defects are observed in the bumps formed on the entire surface of the substrate. FIG. 25 shows bumps formed by plating as carried out while stirring the plating solution by moving a paddle, having a thickness of 4 mm, at a velocity whose average absolute value is 40 cm/sec. The bumps formed on the entire surface of the substrate have defects and have abnormal shapes. As can be seen from FIGS. 24 and 25, the mere increase in paddle thickness is insufficient.

Figure 26:
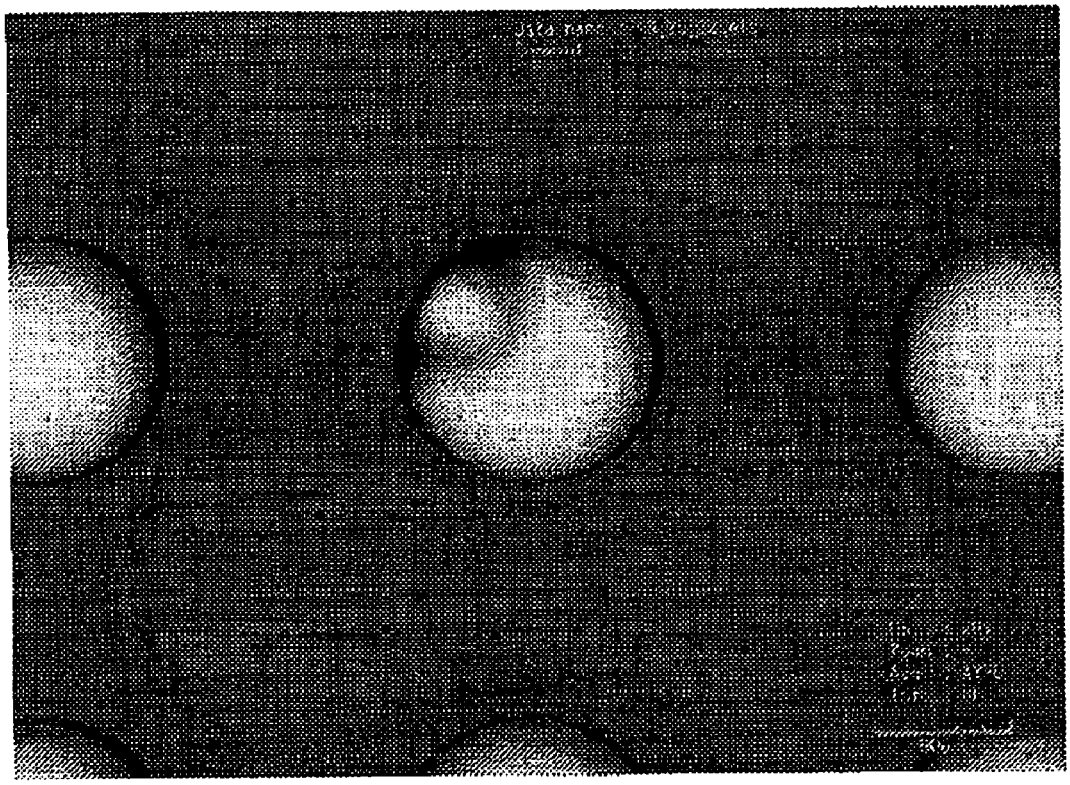
FIG. 26 is a photomicrograph of bumps formed by plating as carried out while stirring a plating solution by moving the paddle, having a thickness of 4 mm, at a velocity whose average absolute value is 67 cm/sec.
Figure 27:
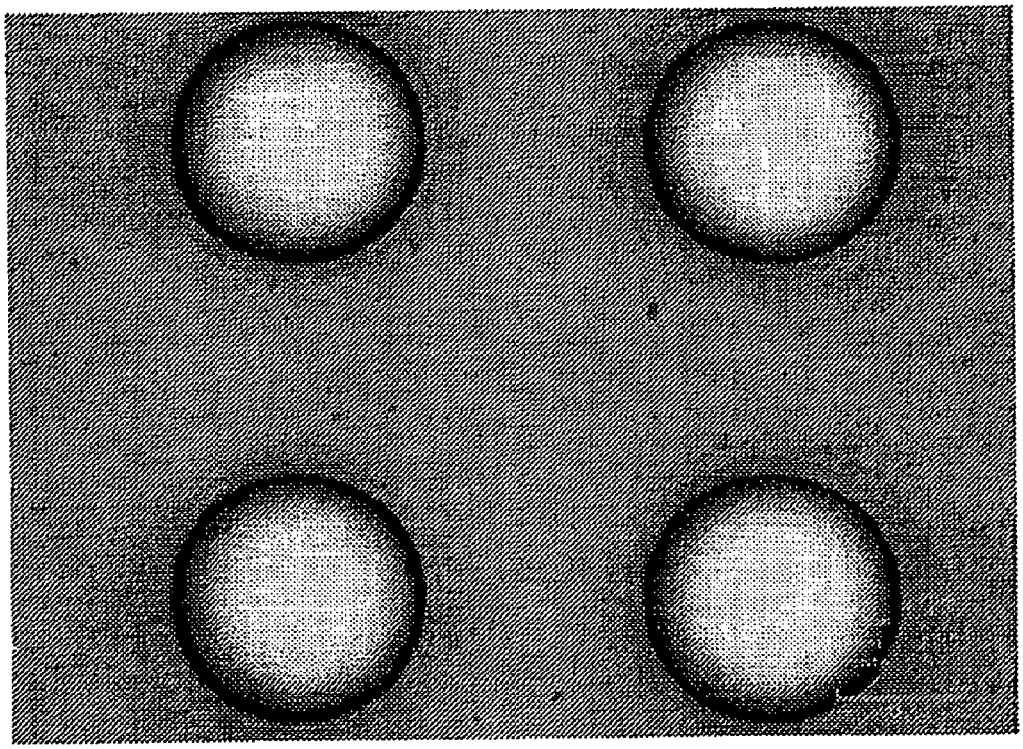
FIG. 27 is a photomicrograph of bumps formed by plating as carried out while stirring a plating solution by moving the paddle, having a thickness of 4 mm, at a velocity whose average absolute value is 83 cm/sec.
Figure 28:
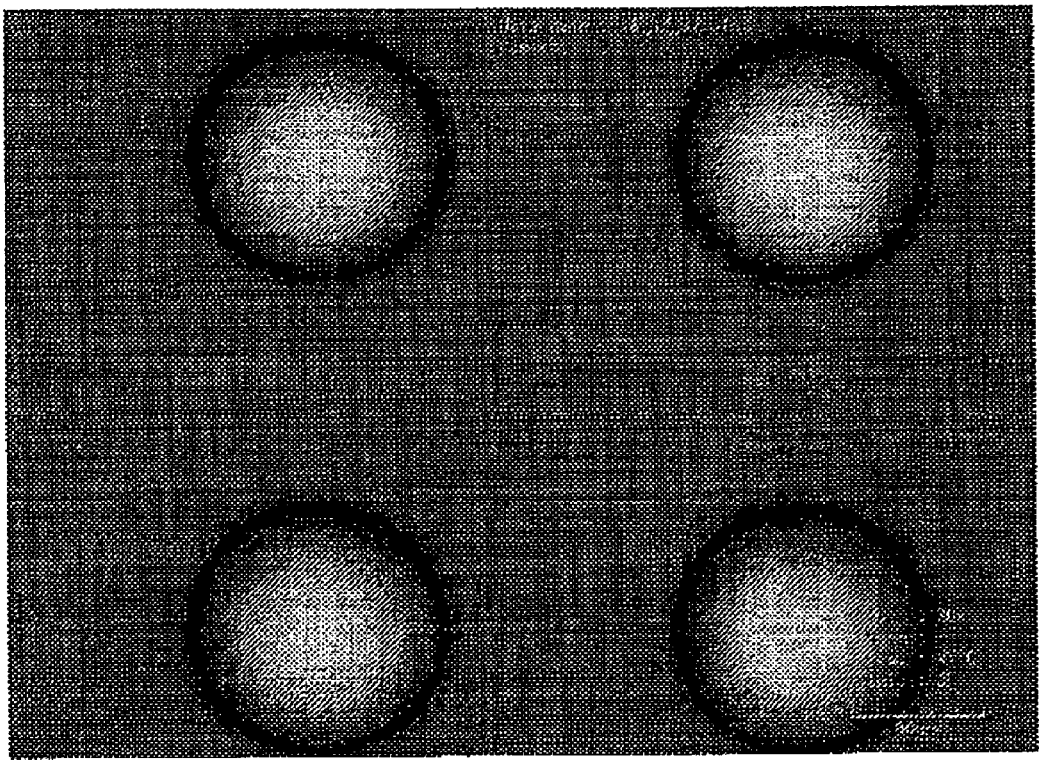
FIG. 28 is a photomicrograph of bumps formed by plating as carried out while stirring a plating solution by moving a paddle, having a thickness of 3 mm, at a velocity whose average absolute value is 83 cm/sec.

FIG. 26 shows bumps formed by plating as carried out while stirring the plating solution by moving the paddle, having a thickness of 4 mm, at a velocity whose average absolute value is 67 cm/sec. Defects are observed in the bumps formed on the entire surface of the substrate. FIG. 27 shows bumps formed by plating as carried out while stirring the plating solution by moving the paddle, having a thickness of 4 mm, at a velocity whose average absolute value is 83 cm/sec. The bumps formed on the entire surface of the substrate are good defect-free bumps. The above difference between the bumps of FIG. 26 and the bumps of FIG. 27 is considered to be due to the fact that when the movement velocity of the paddle is low, supply of copper ions is insufficient under the high-current density conditions, resulting in defects in the bumps, whereas when the movement velocity of the paddle is high, a sufficient amount of copper ions can be supplied, resulting in the formation of defect-free bumps. When plating is carried out under the same high-current density conditions while stirring the plating solution by moving a paddle, having a thickness of 3 mm, at a velocity whose average absolute value is 83 cm/sec, no defect is observed in the bumps formed on the entire surface of the substrate, as shown in FIG. 28. As can be seen from comparison between FIGS. 27 and 28, the use of the paddle having a thickness of 3 mm produces bumps having a rounder top as compared to the use of the paddle having a thickness of 4 mm.

Figure 29:
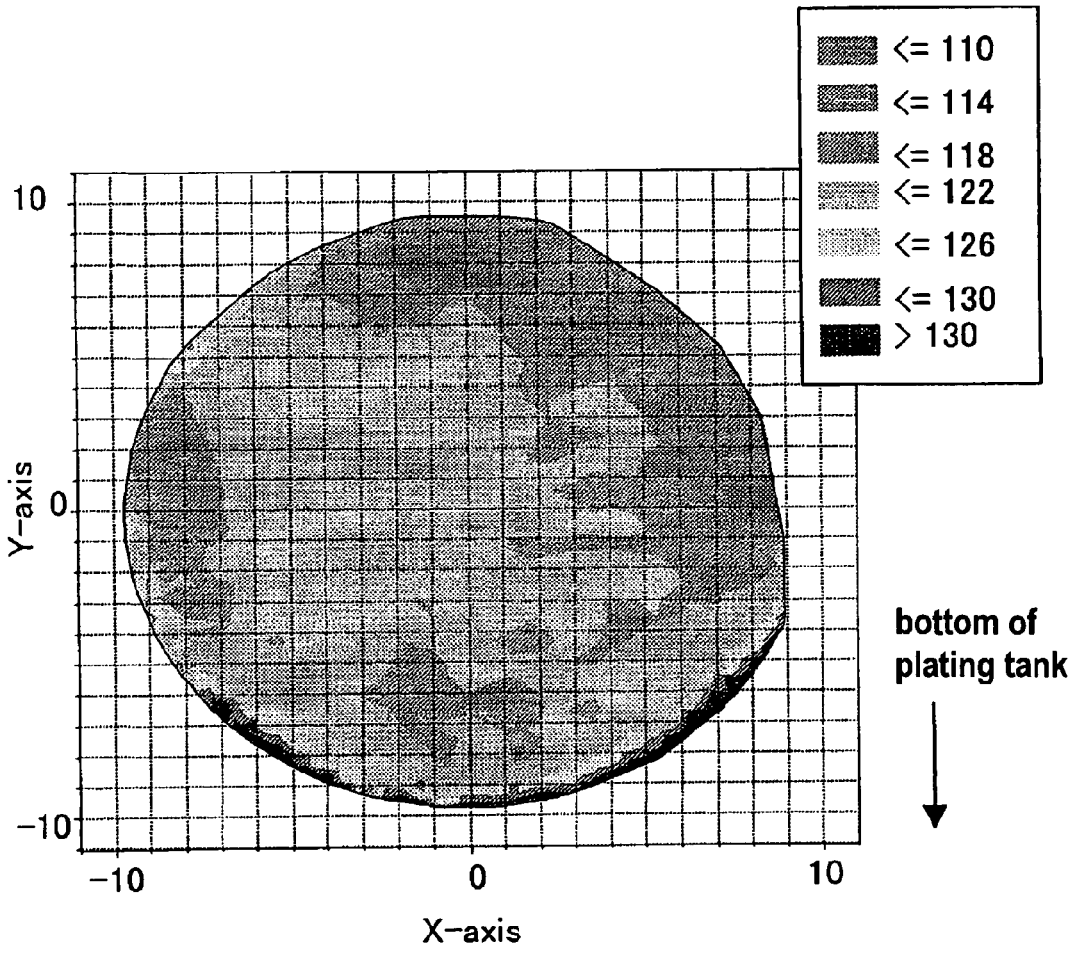
FIG. 29 is a diagram showing the distribution in a substrate of the heights of bumps formed by plating as carried out by using a plating tank without a shield plate provided under a separation plate.
Figure 30:
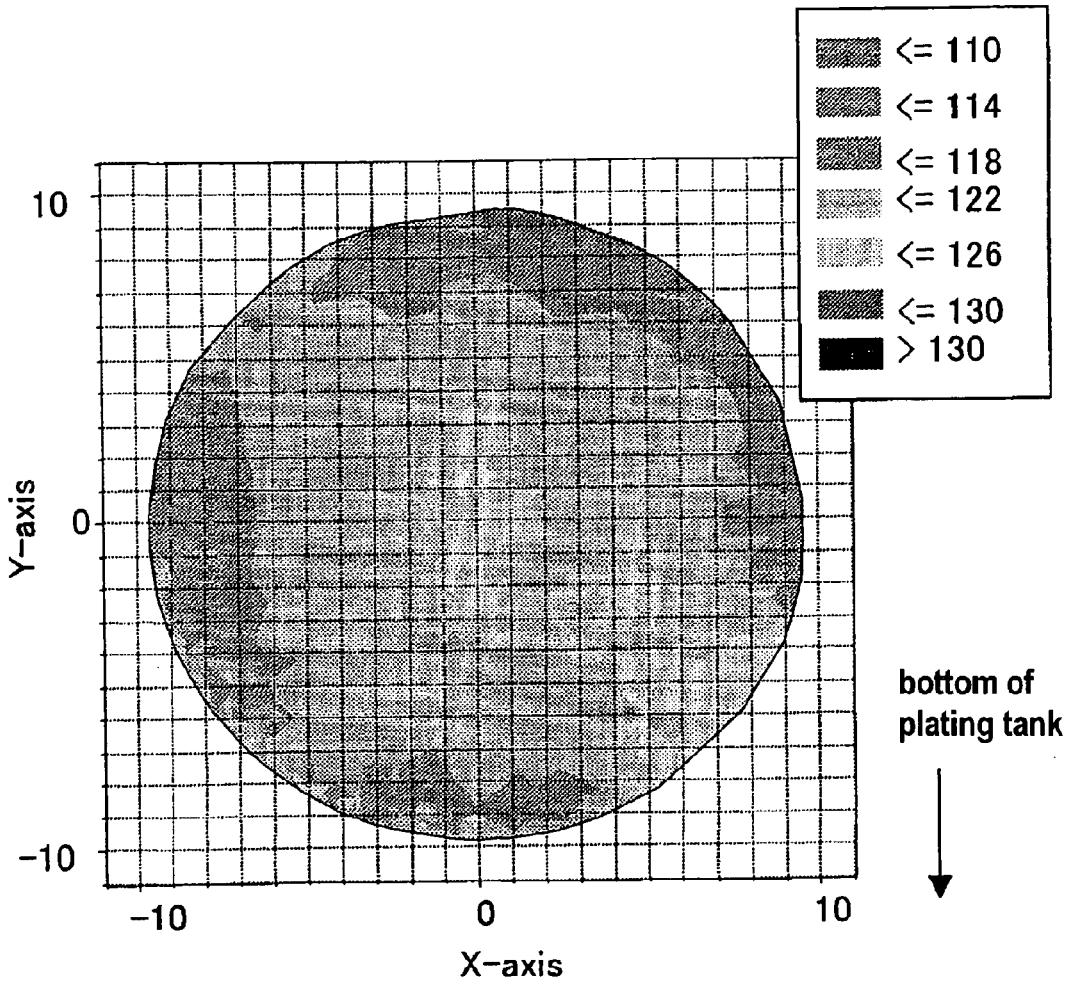
FIG. 30 is a diagram showing the distribution in a substrate of the heights of bumps formed by plating as carried out by using a plating tank with a shield plate provided under the separation plate.

FIG. 29 shows the distribution in a substrate of the heights of bumps formed by plating as carried out by using a plating tank without a shield plate provided under a separation plate, and FIG. 30 shows the distribution in a substrate of the heights of bumps formed by plating as carried out by using a plating tank with a shield plate provided under the separation plate. The unit of the numerical values in the explanatory note is "μm". As shown in FIG. 29, when no shield plate is used, the plating thickness (height of bump) is larger in the edge potion of the substrate near the bottom of the plating tank than in the central portion, whereas as shown in FIG. 30, when the shield plate is used, the plating thickness in the edge potion of the substrate near the bottom of the plating tank is decreased to approximately the same level as the plating thickness in the central portion.

Figure 31:
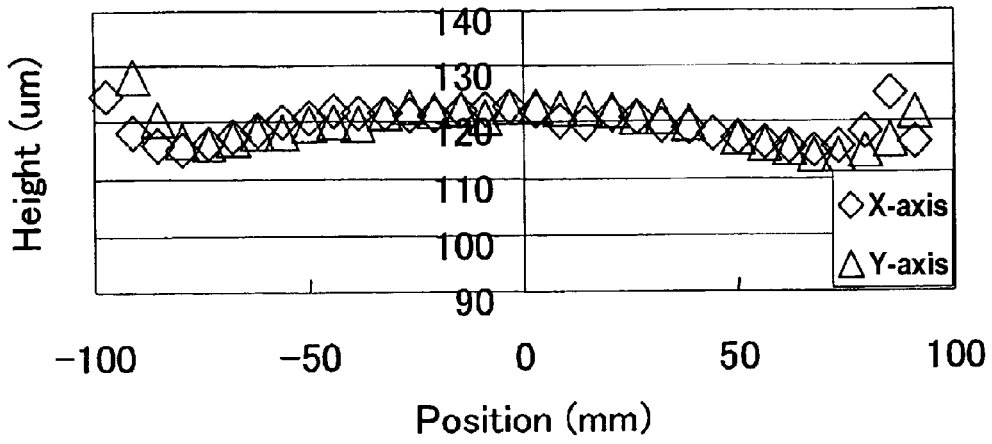
FIG. 31 is a graph showing the in-plane uniformity in a substrate of the heights of bumps formed by plating as carried out using a 5 mm-thick flat regulation plate having an opening in the center, disposed at a distance of 35 mm from the substrate, while stirring a plating solution by moving a paddle at a velocity whose average absolute value is 20 cm/sec.
Figure 32:
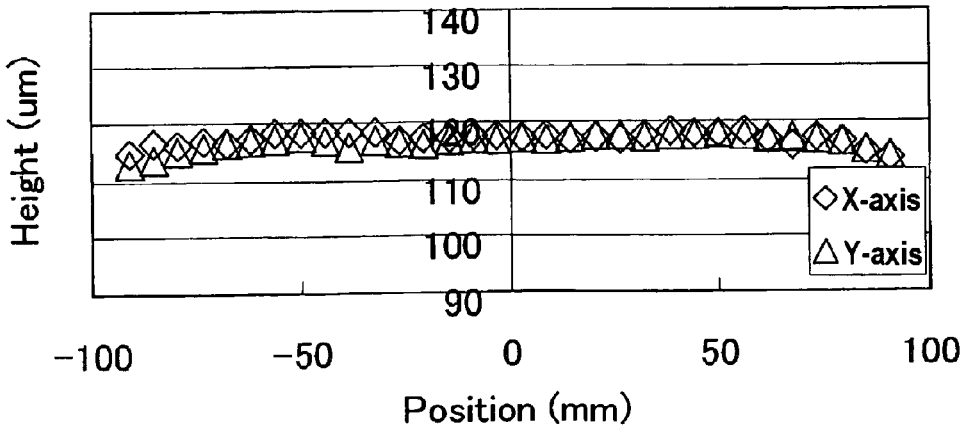
FIG. 32 is a graph showing the in-plane uniformity in a substrate of the heights of bumps formed by plating as carried out using the regulation plate shown in FIG. 7, disposed at a distance of 15 mm from the substrate, while stirring a plating solution by moving the paddle at a velocity whose average absolute value is 83 cm/sec.
Figure 33:
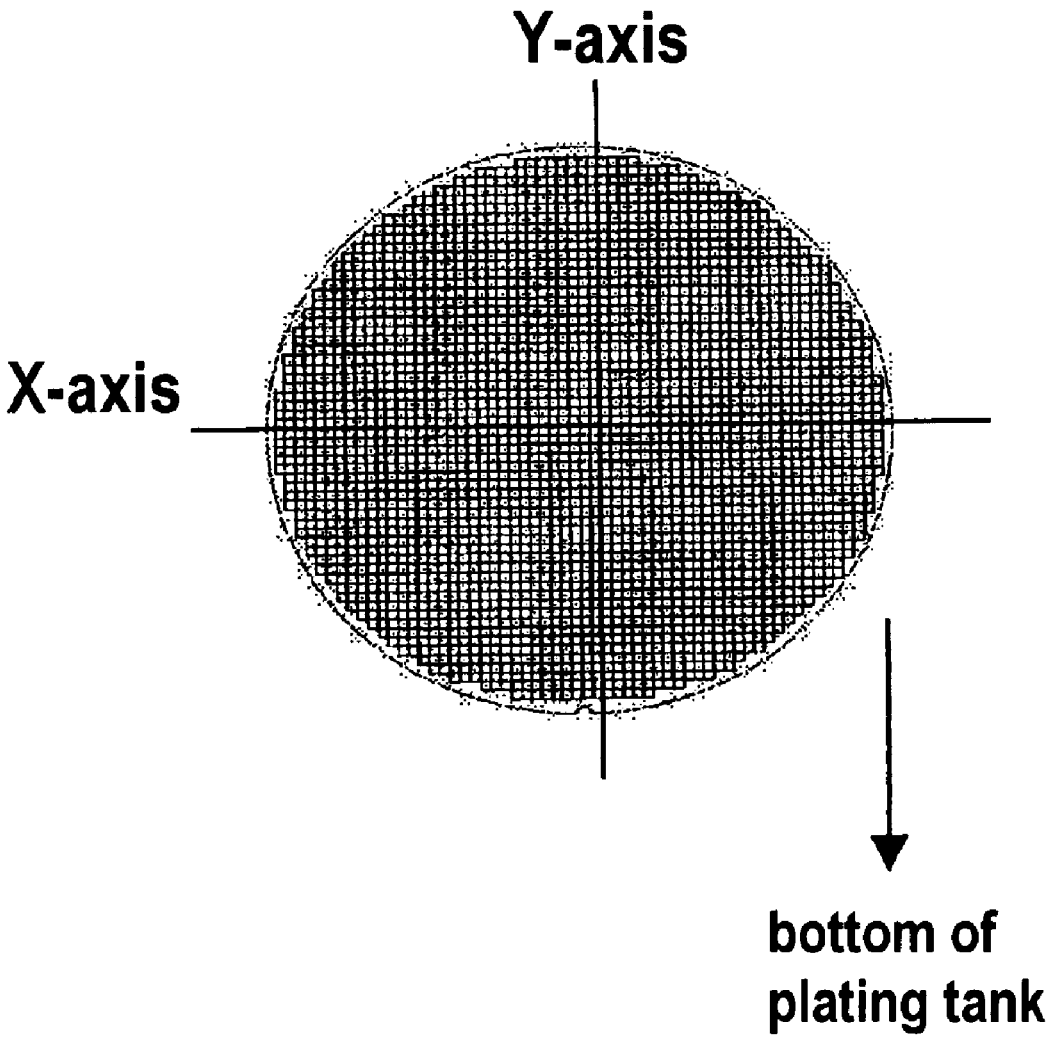
FIG. 33 is a diagram illustrating the X-axis and Y-axis referred to in FIGS. 31 and 32.

FIGS. 31 and 32 are graphs showing the in-plane uniformity in a substrate of the heights of bumps formed on the substrate by different plating methods which use regulation plates having different shapes and disposed at different distances from the substrate, and use different movement velocities of a paddle for stirring of a plating solution. The X-axis and Y-axis referred to in FIGS. 31 and 32 are the orthogonal axes illustrate in FIG. 33. In particular, FIG. 31 shows the in-plane uniformity of the heights of bumps formed by plating as carried out using a 5 mm-thick flat regulation plate having an opening in the center and having no flange portion, disposed at a distance of 35 mm from the substrate, while stirring the plating solution by moving a paddle at a velocity whose average absolute value is 20 cm/sec. The distribution of the heights of bumps (plating thickness) represents a W-shaped distribution curve. FIG. 32 shows the in-plane uniformity of the heights of bumps formed by plating as carried out using the regulation plate shown in FIG. 7, disposed at a distance of 15 mm from the substrate, while stirring the plating solution by moving the paddle at a velocity whose average absolute value is 83 cm/sec. The bump height (plating thickness) distribution curve is flatter than that of FIG. 31, indicating enhanced in-plane uniformity of the bumps of FIG. 32.

Figure 34:
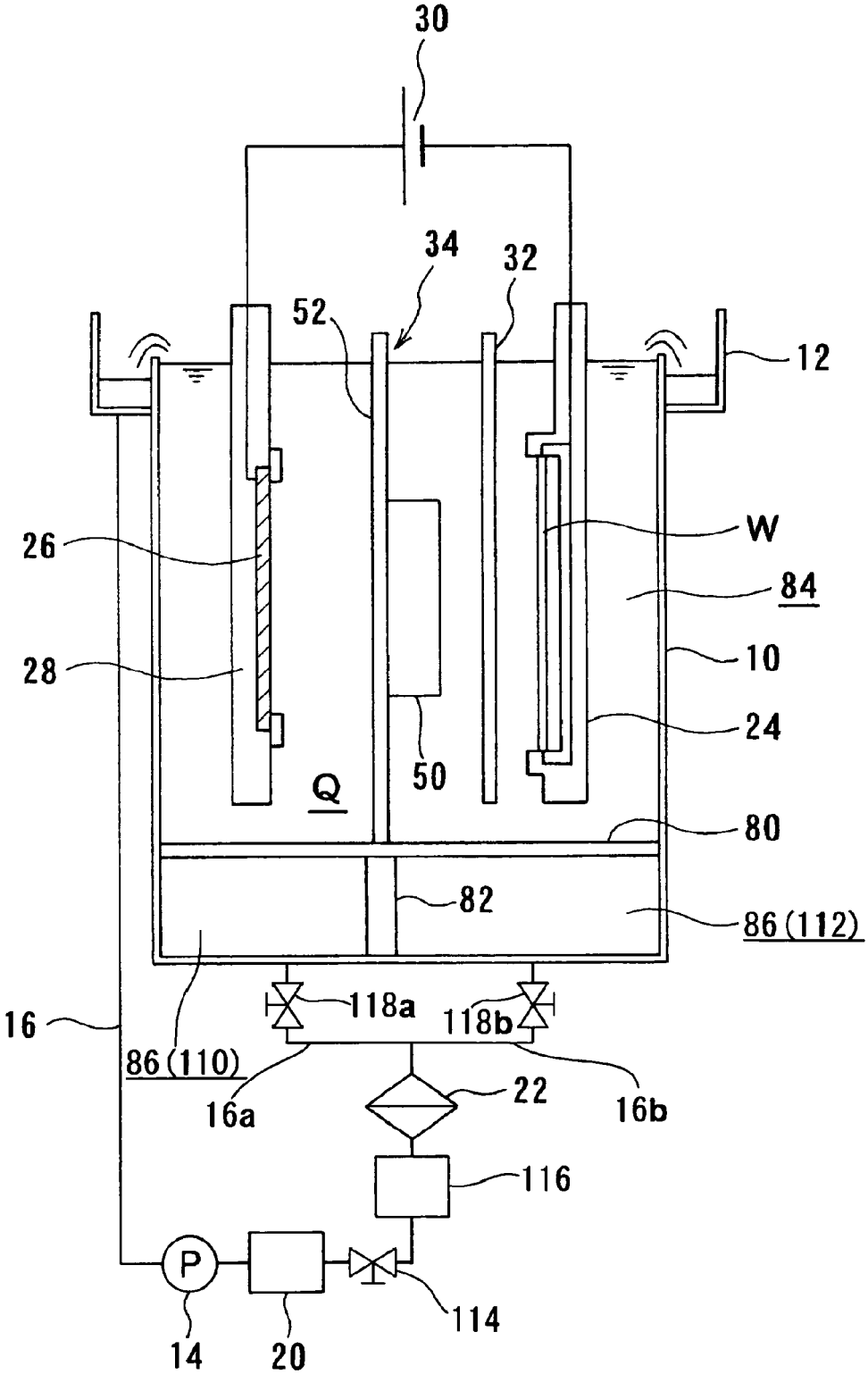
FIG. 34 is a vertical sectional front view of a plating apparatus according to another embodiment of the present invention.

FIG. 34 shows a plating apparatus according to another embodiment of the present invention. The plating apparatus of this embodiment uses a shield plate 82 which extends vertically downward from the lower surface of the separation plate 80 and whose lower end reaches the bottom wall of the plating tank 10. The plating solution distribution chamber 86 formed under the separation plate 80 is thus completely separated by the shield plate 82 into an anode-side solution distribution chamber 110 and a cathode-side solution distribution chamber 112. The lower end surface of the shield plate 82 is fixed to the bottom wall of the plating tank 10, e.g., by welding.

The plating solution supply route 16 is provided with a main valve 114 and a flowmeter 116, located between the constant-temperature unit 20 and the filter 22. The plating solution supply route 16 branches into two branch routes 16a, 16b downstream of the filter 22, and the branch routes 16a, 16b are connected to the anode-side solution distribution chamber 110 and the cathode-side solution distribution chamber 112, respectively. The branch routes 16a, 16b are respectively provided with valves 118a, 118b.

By thus completely separating the plating solution distribution chamber 86 into the anode-side solution distribution chamber 110 and the cathode-side solution distribution chamber 112 by the shield plate 82, it becomes possible to securely prevent potential lines, generated from the anode 26, from passing through the plating solution in the plating solution distribution chamber 86 and leaking into the cathode (substrate) side. Further, the plating solution can be supplied through the plating solution supply route 16 separately into the anode-side solution distribution chamber 110 and the cathode-side solution distribution chamber 112.

Figure 35:
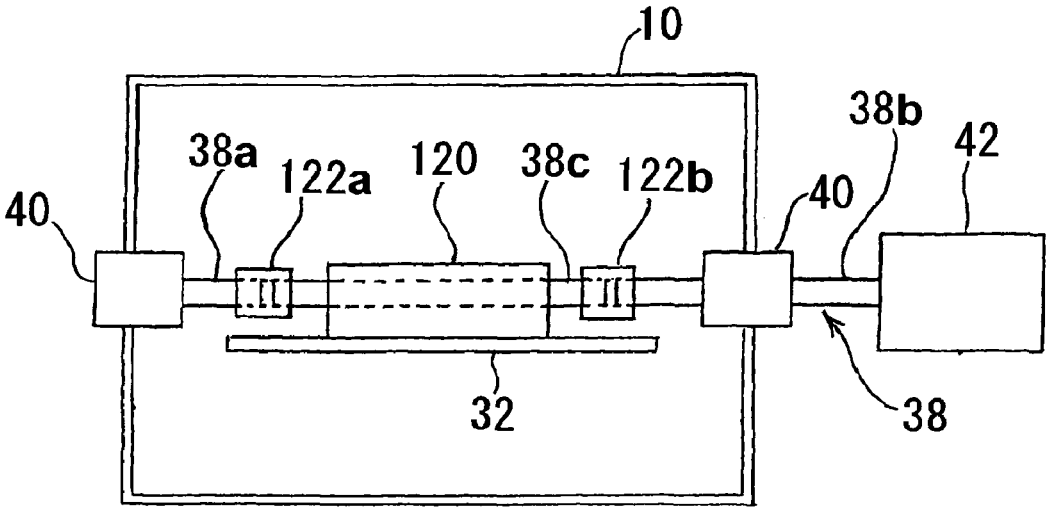
FIG. 35 is a plan view showing another paddle drive mechanism together with the plating tank.
Figure 36:
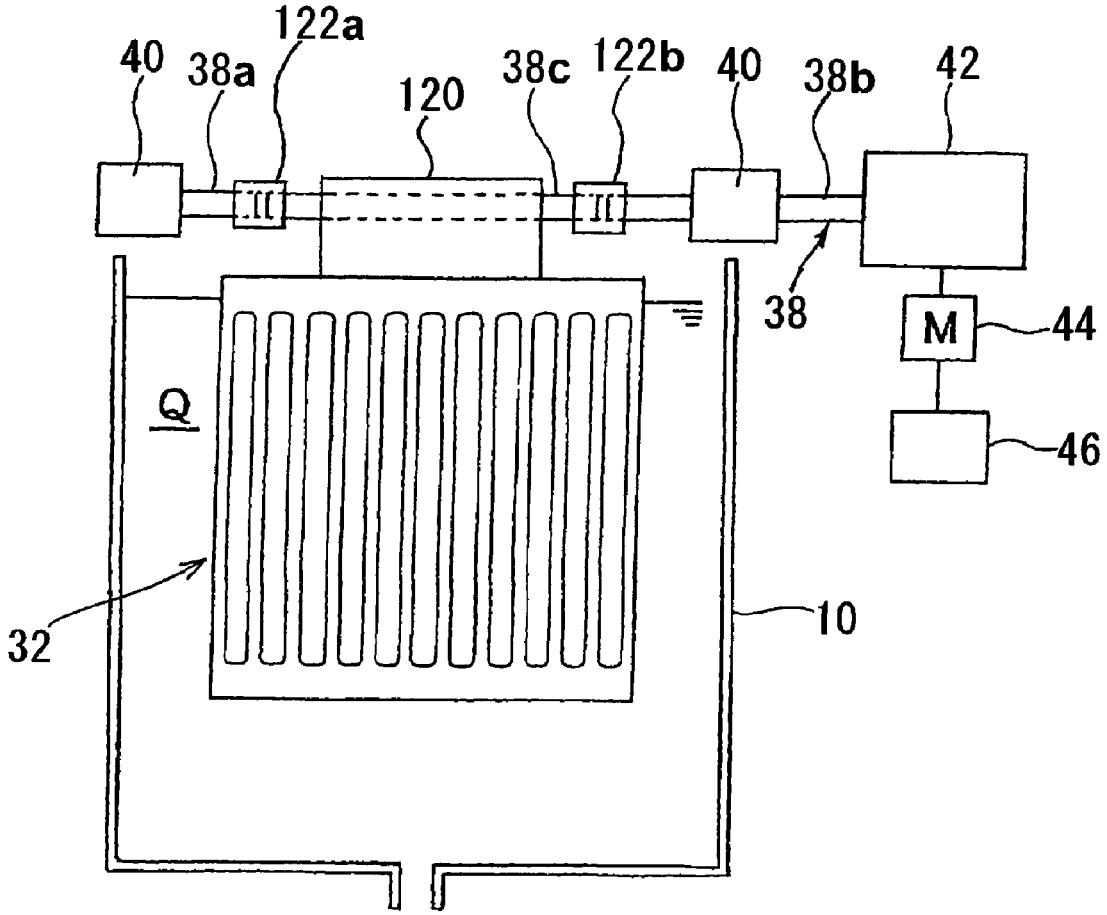
FIG. 36 is a vertical sectional front view of FIG. 35.

FIGS. 35 and 36 show another drive mechanism for the paddle 32 together with the plating tank 10. In this embodiment, the paddle 32, at its upper end, is mounted to a paddle holding member 120. The shaft 38, extending from the paddle drive section 42, is divided into three portions: right and left end shafts 38a, 38b each supported by the shaft holder 40, and an intermediate shaft 38b lying between the end shafts 38a, 38b. The intermediate shaft 38c penetrates the paddle holding member 120, with its both ends exposed. The intermediate shaft 38c, at its one end, is connected by a coupling 122a to the end shaft 38a and, at the other end, is connected by a coupling 122b to the end shaft 38b. In this embodiment, a screw-type coupling is employed as the couplings 122a, 122b. However, any coupling, such as a so-called quick coupling, may be used.

For example, upon replacement of the paddle 32, the paddle 32, the paddle holding member 120 and the intermediate shaft 38c can be removed all together from the plating apparatus through the couplings 122a, 122b without removing the shaft holders 40 from the plating apparatus. Replacement of the paddle 32 can therefore be performed easily and quickly. Further, when re-mounting the paddle 32 in the plating apparatus, the paddle 32 can be mounted at a predetermined position with good repeatability. Furthermore, removal and re-mounting of the regulation plate 34 can also be performed easily by temporarily removing the paddle 32 from the plating apparatus.

Figure 37:
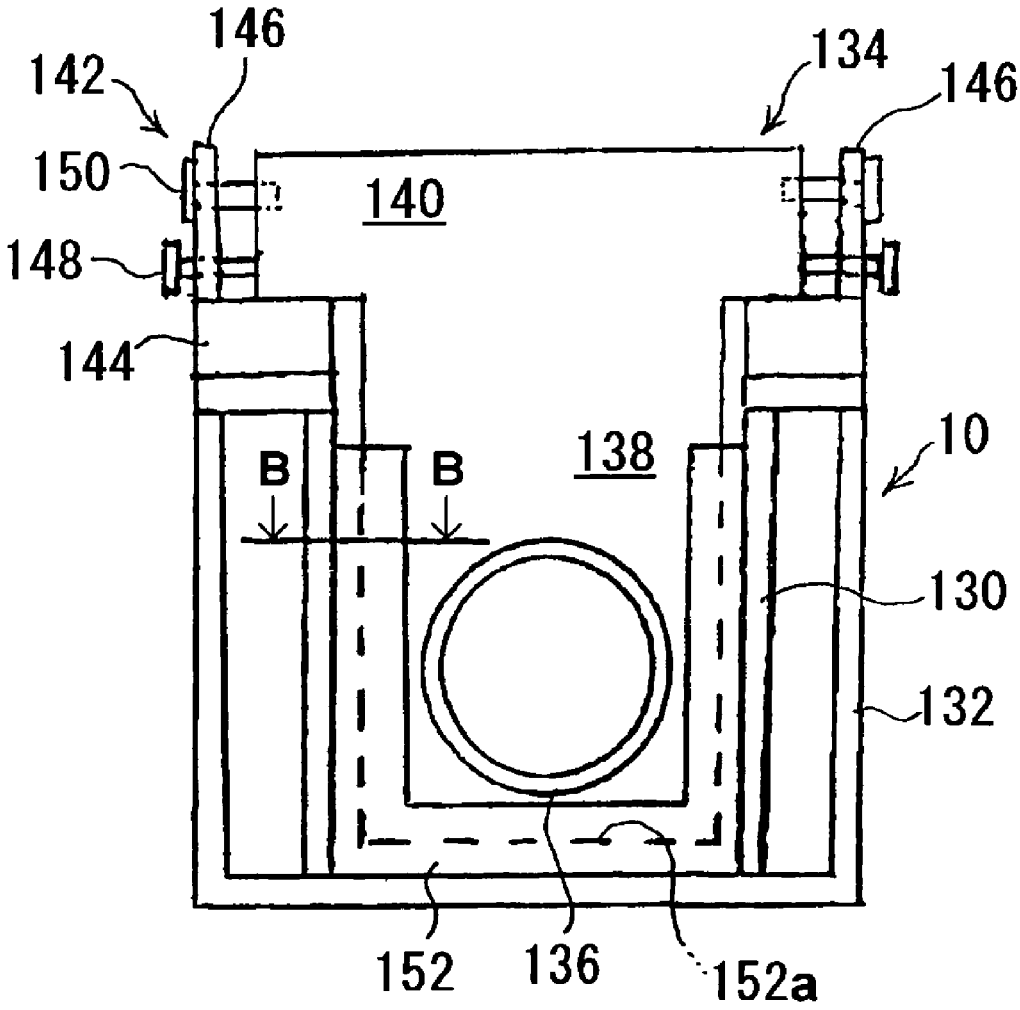
FIG. 37 is a vertical sectional side view showing another regulation plate, provided with a regulation plate movement mechanism, and another plating tank.

FIG. 37 shows another regulation plate, which is provided with a regulation plate movement mechanism, and another plating tank. The plating tank 10 of this embodiment comprises an inner tank 130 and an outer tank 132 that surrounds the periphery of the inner tank 130. A regulation plate 134 is comprised of a rectangular tabular body portion 138 having a cylindrical portion 136, and a grip portion 140 which is wider than the body portion 138 and integrally formed to a top of the body portion 138. In this embodiment, positioning of the regulation plate 134 in a lateral (horizontal) direction parallel to a substrate W is performed by a regulation plate movement mechanism 142 via the grip portion 140.

The regulation plate movement mechanism 142 includes a regulation plate support 144 disposed across the top opening of the plating tank 10; a pair of brackets 146 vertically mounted on the peripheral end of the regulation pate support 144; lateral press bolts 148 which each move horizontally by engagement with a female thread formed in each bracket 146; and lateral fixing bolts 150 which each penetrate an unloaded hole formed in each bracket 146 and extend horizontally. When the grip portion 140 of the regulation plate 134 is placed on the regulation plate support 144 and the regulation plate 134 is set in a predetermined position, the lateral press bolts 148 and the lateral fixing bolts 150 are disposed at positions opposite the peripheral end surfaces of the grip portion 140. A female thread for screw engagement with each lateral fixing bolt 150 is formed in each peripheral end surface of the grip portion 140 at a position opposite the lateral fixing bolt 150. The lateral press bolts 148 come into contact with the peripheral end surfaces of the grip portion 140 and, when fastened, press the regulation plate 134 inward.

Thus, after placing the grip portion 140 of the regulation plate 134 on the regulation plate support 144 and setting the regulation plate 134 in a predetermined position, positioning of the regulation plate 134 in a lateral direction parallel to the substrate W can be performed by the lateral press bolts 148, and the regulation plate 134 can be fixed by the lateral fixing bolts 150. The positioning of the regulation plate 134 by the lateral press bolts 148 and the lateral fixing bolts 150 may be performed not via the grip portion 140 but via some other portion of the regulation plate 134. The lateral (horizontal) movement distance of the regulation plate 134 can be adjusted with ease by controlling the number of revolutions of each lateral press bolt 148 having a predetermined pitch. The lateral fixing bolts 150 each serve as a draw bolt when the lateral press bolts 148 are not in contact with the peripheral end surfaces of the grip portion 140 and thus do not press on the regulation plate 134.

In order to move the regulation plate 134 in a lateral direction parallel to the substrate W, a gap is formed between the peripheral surface of the body portion 138 of the regulation plate 134 and the inner peripheral surface of the inner tank 130 of the plating tank 10. In this embodiment, a guide member 152, having an inwardly-open channel-like recess 152a, is provided in the inner tank 130 at a position opposite the peripheral surface of the body portion 138 of the regulation plate 134, and the peripheral end portion of the body portion 138 of the regulation plate 134 is inserted into the recess 152a of the guide member 152. The guide member 152 enables the regulation plate 134 to move laterally (horizontally) parallel to the substrate W using the guide member 152 as a guide while keeping a constant distance between the regulation plate 134 and the substrate W. Further, the insertion of the peripheral end portion of the body portion 138 of the regulation plate 134 into the recess 152a of the guide member 152 can prevent leakage of electric field from the periphery of the regulation plate 134.

Figure 38:
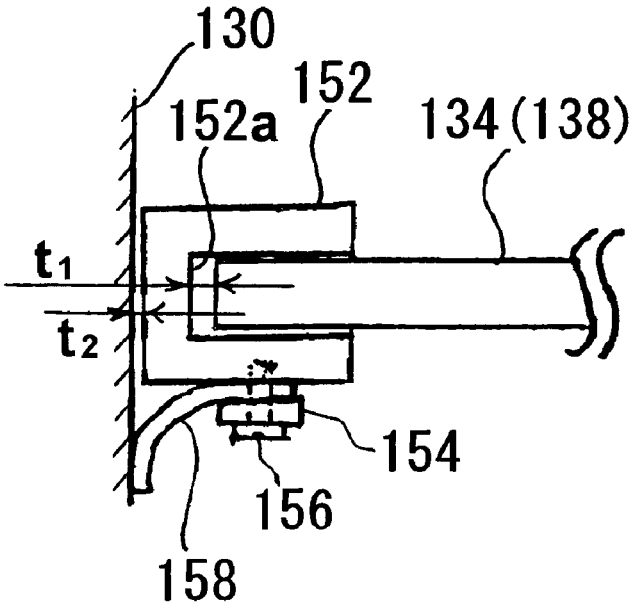
FIG. 38 is a cross-sectional view taken along line B-B of FIG. 37.

As shown in FIG. 38, a movement gap $t_1$ is provided between the bottom of the recess 152a of the guide member 152 and the peripheral surface of the body portion 138 of the regulation plate 134. The movement gap $t_1$ is, for example, 1 mm to 5 mm, and preferably 1 mm to 2 mm. For construction reasons, a gap $t_2$ is generally formed between the guide member 152 and the inner peripheral surface of the inner tank 130. In this embodiment, in order to prevent leakage of electric potential lines from the gap $t_2$, an electric field-shielding member 158, e.g., comprised of a rubber seal, is fixed on the guide member 152 by a seal holding member 154 and fixing bolts 156, with the free end of the electric field-shielding member 158 in pressure contact with the inner peripheral surface of the inner tank 130. Though, in this embodiment, the electric field-shielding member 158 is disposed on the anode side of the guide member 152, it may be disposed on the cathode (substrate) side or both sides of the guide member 152.

Figure 39:
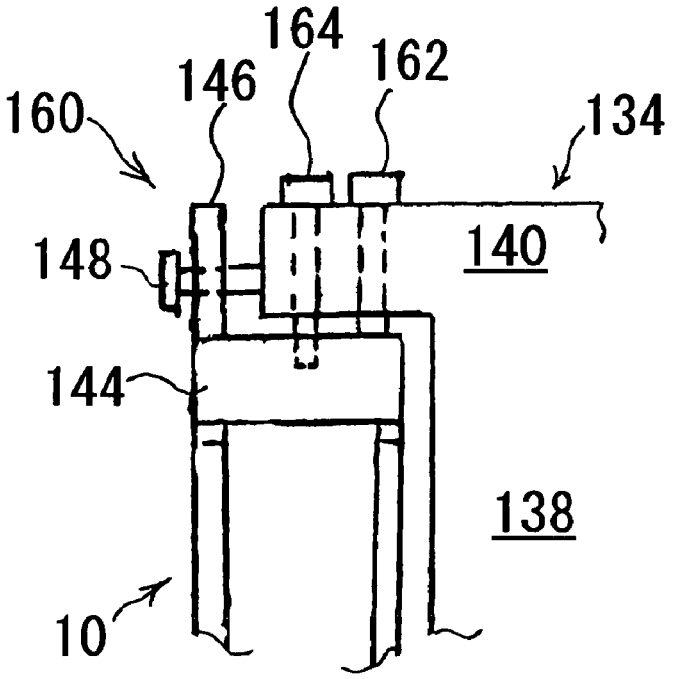
FIG. 39 is a diagram showing the main portion of the regulation plate provided with another regulation plate movement mechanism.

Though, in this embodiment, the regulation plate 134 is moved laterally parallel to the substrate W by the regulation plate movement mechanism 142, it is also possible to move the regulation plate 134 laterally and vertically parallel to the substrate W. FIG. 39 shows a regulation plate movement mechanism 160 adapted to move the regulation plate 134 laterally and vertically parallel to the substrate W. The regulation plate movement mechanism 160 differs from the regulation plate movement mechanism 142 shown in FIG. 37 in that a vertically-penetrating heli-sert female thread is provided in each of the outwardly-projecting portions of the grip portion 140 of the regulation plate 134, and the lower end of a vertical press bolt 162, which is in screw engagement with the female thread, is brought into contact with the top surface of the regulation plate support 144, and that a slit, extending in the width direction of the plating tank 10, is provided at the end of each of the outwardly-projecting portions of the grip portion 140, and a vertical fixing bolt 164 is inserted into the slit and the lower portion of the vertical fixing volt 164 is engaged with a female thread provided in the regulation plate support 144. This embodiment does not employ lateral fixing bolts.

According to this embodiment, when the vertical press bolt 162 is rotated in the fastening direction, the tip of the bolt 162 comes into contact with the top surface of the regulation plate support 144 and, by the reaction force to the contact pressure on the top surface, the regulation plate 134 moves upwardly. On the contrary, the regulation plate 134 moves downwardly when the vertical press bolt 162 is rotated in the loosening direction. After completion of lateral and vertical positioning of the regulation plate 134 with respect to the substrate W, the lower portion of the vertical fixing bolt 164 is engaged with the female thread provided in the regulation plate support 144 to fix the regulation plate 134.

It is possible to use an air cylinder, a servomotor, etc. instead of the press bolts 148, 162. Further, it is possible to use the regulation plate movement mechanism 142 shown in FIG. 37 in combination with the regulation plate movement mechanism 160 shown in FIG. 39 for adjustment of the vertical and lateral positions of the regulation plate 134. In this case, vertically-extending slits for insertion of the lateral fixing bolts 150 may be provided in the brackets 146 so that the regulation plate 134 can be fixed by the lateral fixing bolts 150 despite a vertical displacement of the regulation plate 134. It is also possible to omit the lateral press bolts 148 in the regulation plate movement mechanism 160 shown in FIG. 39 so as to perform only vertical positioning of the regulation plate 134 with respect to the substrate W.

The in-plane uniformity of a thickness of a plated film formed on the surface of the substrate W can be enhanced by finely adjusting the horizontal position of the regulation plate 134 with respect to the substrate W by the regulation plate movement mechanism 142 or by finely adjusting the horizontal and vertical positions of the regulation plate 134 with respect to the substrate W by the regulation plate movement mechanism 160. Particularly, since the regulation plate 134 is disposed at a position close to the substrate W, fine adjustment of the vertical or horizontal position of the regulation plate 134 with respect to the substrate W is important to enhancement of the in-plane uniformity of a thickness of a plated film formed on the substrate W.

Figure 40:
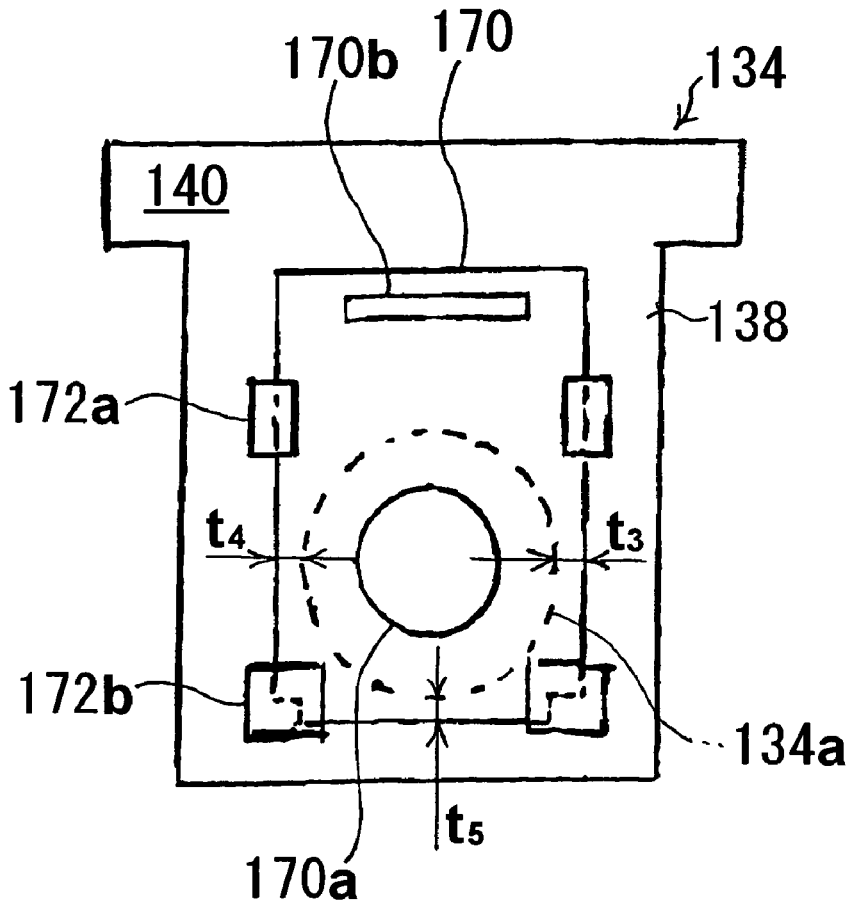
FIG. 40 is a front view of yet another regulation plate.
Figure 41:
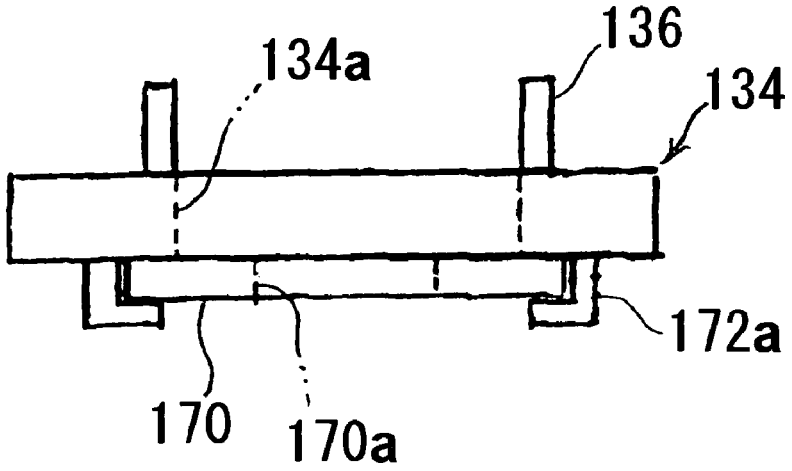
FIG. 41 is a plan view of FIG. 40.

FIGS. 40 and 41 show another regulation plate that adds the following construction to the regulation plate 134 shown in FIG. 37. An auxiliary regulation plate mounting section for mounting of an auxiliary regulation plate 170 is provided on the anode-side surface of the body portion 138 of the regulation plate 134. The auxiliary regulation plate mounting section is comprised of a pair of side hooks 172a and a pair of bottom hooks 172b fixed at positions corresponding to peripheral side portions and at positions corresponding to the bottom corners of the auxiliary regulation plate 170, respectively. The auxiliary regulation plate 170 can be set at a predetermined position with respect to the regulation plate 134 by putting the auxiliary regulation plate 170 in the auxiliary regulation plate mounting section, comprised of the pair of side hooks 172a and the pair of bottom hooks 172b, of the regulation plate 134.

In this embodiment, a regulation plate (8-inch wafer regulation plate) having an opening 134a for 8-inch wafer is used as the regulation plate 134, and an auxiliary regulation plate (6-inch wafer regulation plate) having an opening 170a for 6-inch wafer is used as the auxiliary regulation plate 170. With this construction, when the substrate W is changed from an 8-inch wafer to a 6-inch wafer, this change can be dealt with by merely attaching the auxiliary regulation plate (6-inch wafer regulation plate) 170 to the regulation plate (8-inch wafer regulation plate) 134 without replacing the regulation plate. A gripping opening 170b is provided at a top portion of the auxiliary regulation plate 170.

The lateral sizes $t_3$, $t_4$ and the lower vertical size $t_5$ of the overlap between the regulation plate 134 and the auxiliary regulation plate 170 are each generally not less than 5 mm, preferably not less than 10 mm. This can prevent an electric line from the anode 26 from passing through the gap between the regulation plate 134 and the auxiliary regulation plate 170 and then through the opening 134a of the regulation plate 134 without passing through the opening 170a of the auxiliary regulation plate 170 when the auxiliary regulation plate 170 is attached to the regulation plate 134.

Though this embodiment uses the combination of the 8-inch wafer regulation plate and the 6-inch wafer regulation plate, it is possible to use a combination of any types of two regulation plates (first and second regulation plates). For example, it is possible to usually use the first regulation plate and, when the need arises to adjust the electric field distribution according to the type of the substrate (plating object) used, use the second regulation plate in combination with the first regulation plate.

Figure 42:
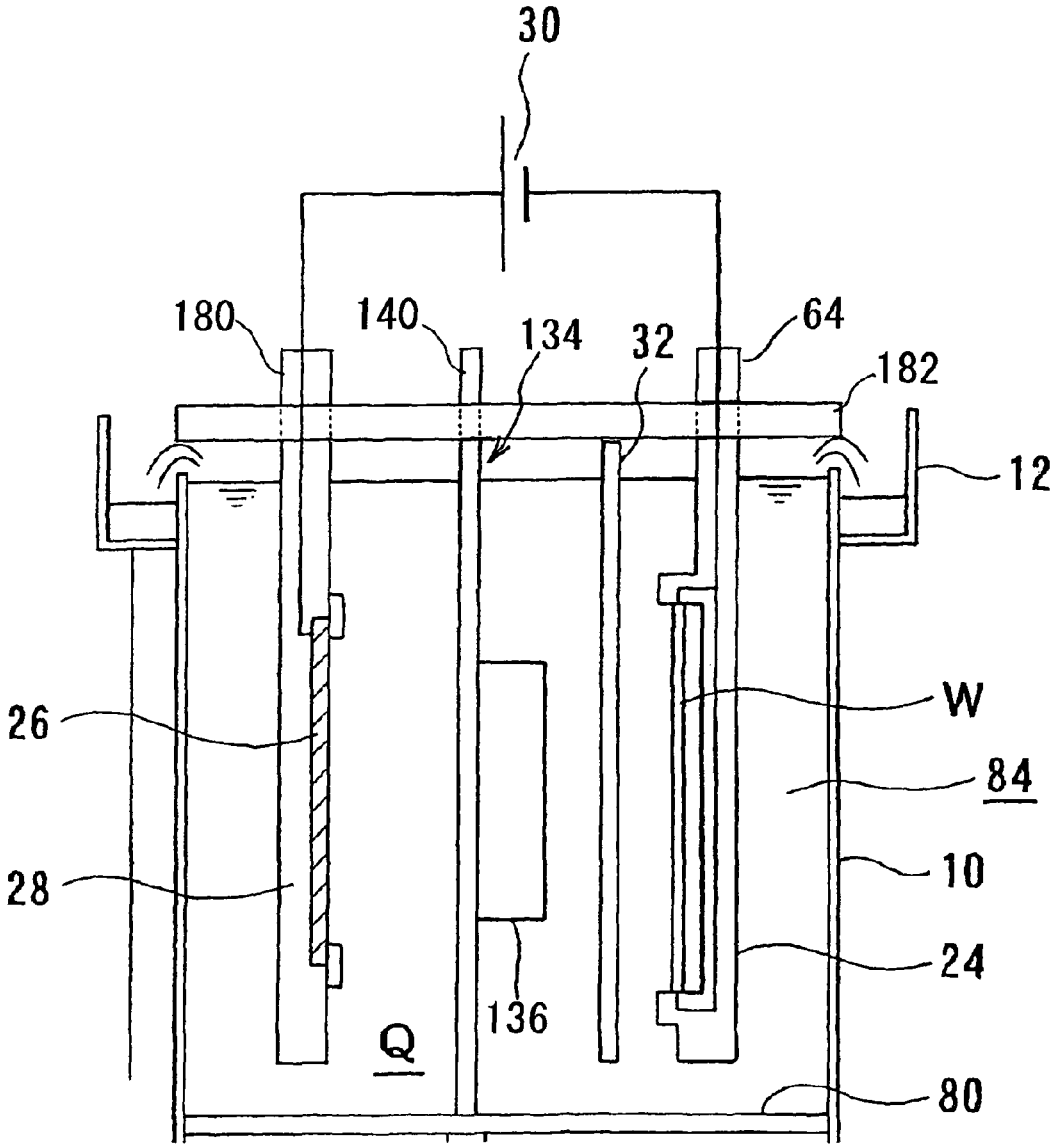
FIG. 42 is a vertical sectional front view of a plating apparatus according to yet another embodiment of the present invention.
Figure 43:
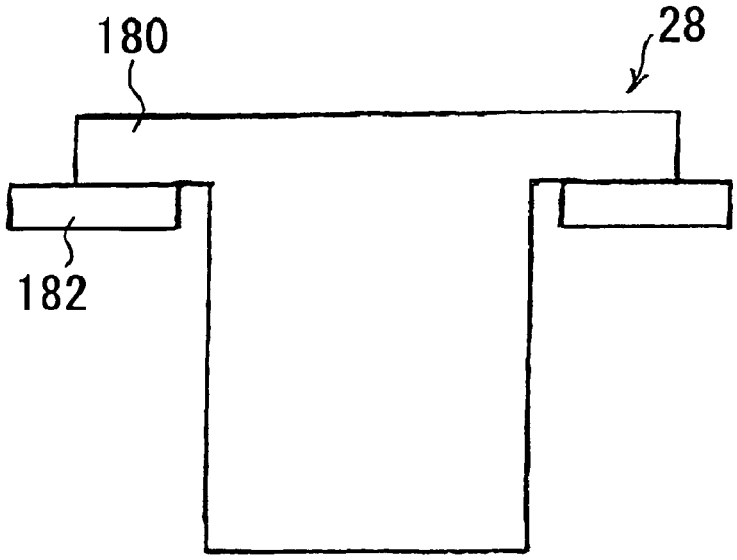
FIG. 43 is a front view of an anode holder and a positioning/holding section both for use in the plating apparatus shown in FIG. 42.

FIGS. 42 and 43 show the main portion of a plating apparatus according to yet another embodiment of the present invention. The plating apparatus of this embodiment differs from the plating apparatus shown in FIG. 1 in that the former uses an anode holder 28 having a wide grip portion 180 at the top, shown in FIG. 43, and the regulation plate 134 having the wide grip portion 140, shown, e.g., in FIG. 37, and that the anode holder 28, the regulation plate 134 and the substrate holder 24 are set, respectively via the grip portion 180, the grip portion 140 and the holder arms 64 (see FIG. 9), on a single positioning/holding section 182 disposed across the top opening of the plating tank 10. Thus, the grip portion 180 of the anode holder 28, the grip portion 140 of the regulation plate 134 and the holder arms 64 of the substrate holder 24 are all placed and set on the same positioning/holding section 182 comprised of a single unitary member. This makes it possible to securely make the central axes of the anode 26 held by the anode holder 28, the cylindrical portion 136 of the regulation plate 134 and the substrate W held by the substrate holder 24 coincide with each other.

Though, in this embodiment, the grip portion 180 of the anode holder 28, the grip portion 140 of the regulation plate 134 and the holder arms 64 of the substrate holder 24 are placed on the positioning/holding section 182 comprised of a single member, it is also possible to place other portions of the anode holder 28, the regulation plate 134 and the substrate holder 24 on the positioning/holding section 182 insofar as vertical positioning of the anode holder 28, the regulation plate 134 and the substrate holder 24 can be performed with the positioning/holding section 182 as a reference.

Figure 44:
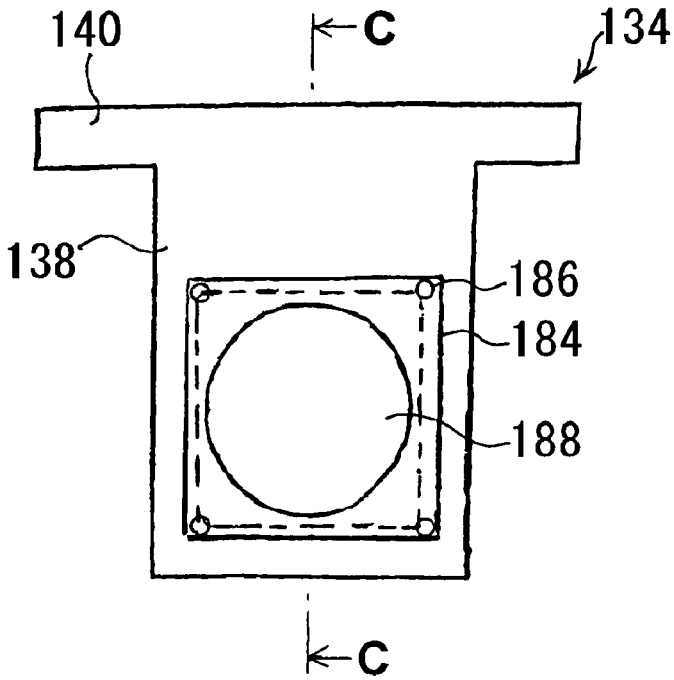
FIG. 44 is a front view of yet another regulation plate.
Figure 45:
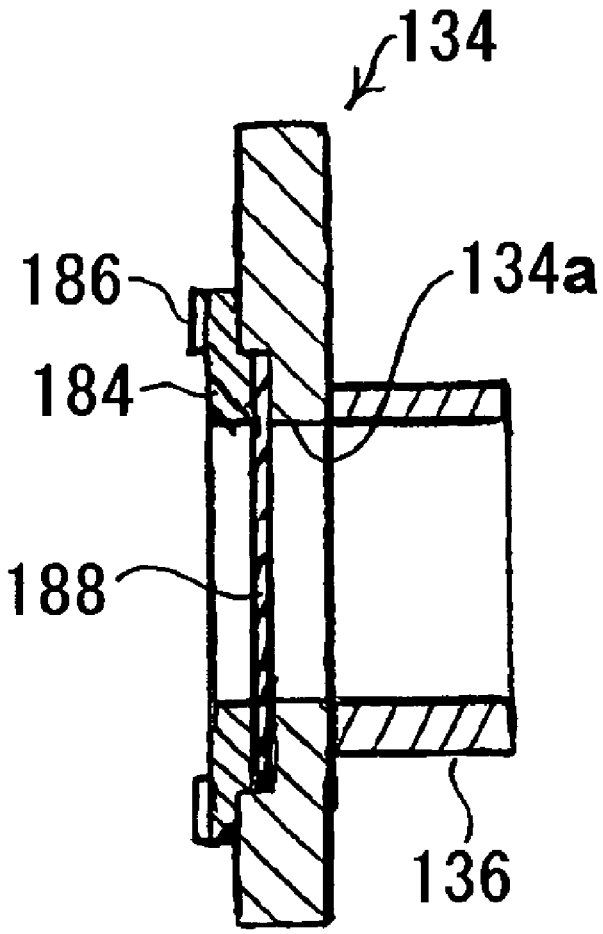
FIG. 45 is a cross-sectional view taken along the line C-C of FIG. 44.

FIGS. 44 and 45 show yet another regulation plate. The regulation plate adds the following construction to the regulation plate 134 shown, e.g., in FIG. 7. A diaphragm 188 is fixed by a fixing plate 184 and fixing bolts 186 to the anode-side surface of the body portion 138 of the regulation plate 134 such that the diaphragm 188 covers the entire central opening 134a. The diaphragm 188 is comprised of a cation exchanger which is permeable to metal ions but not permeable to additives, or a functional membrane (neutral filtration membrane). By thus covering the opening 134a of the regulation plate 134 with the diaphragm 188, decomposition and consumption of additives, contained in a plating solution, at the surface of the anode 26 can be prevented.

Figure 46:
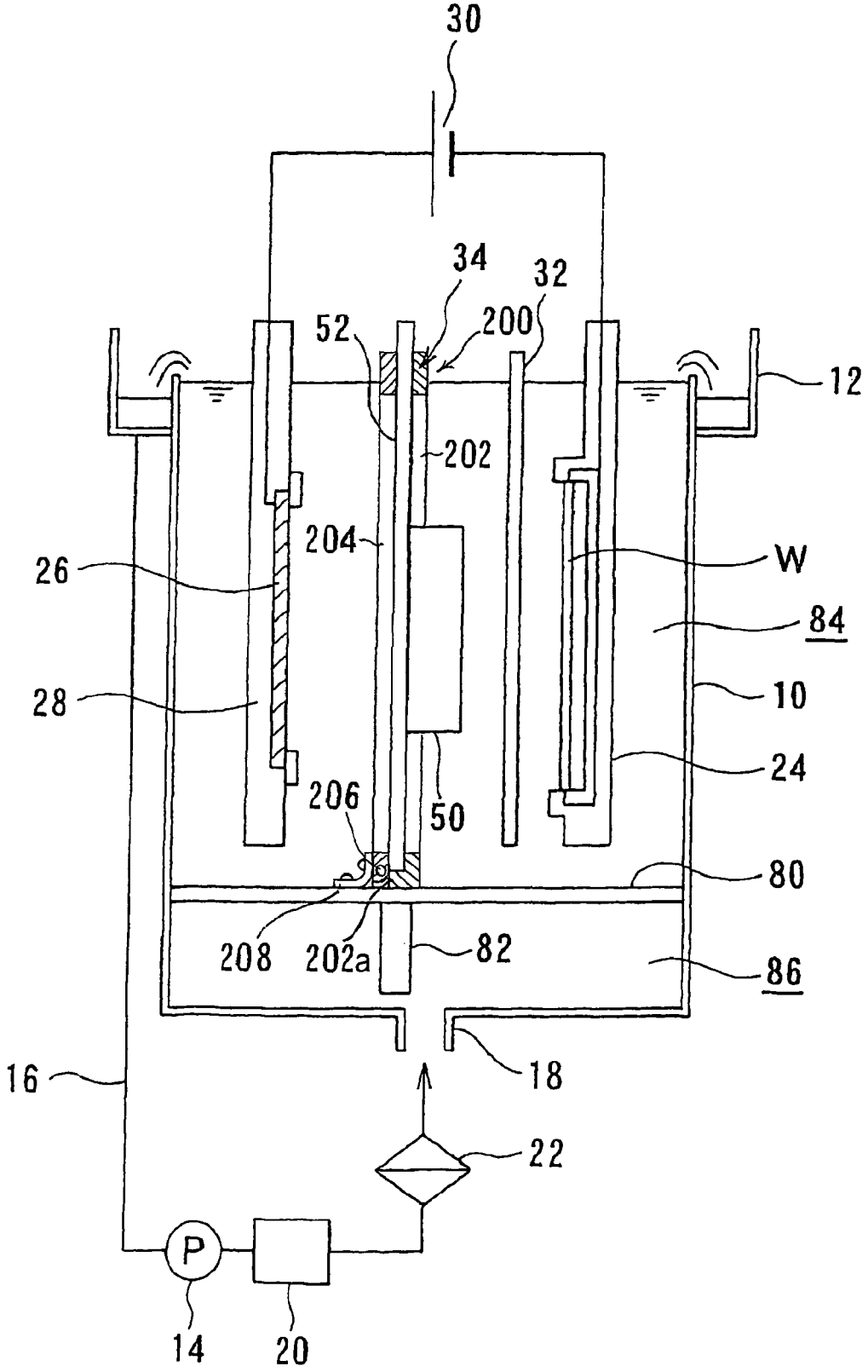
FIG. 46 is a vertical sectional front view of a plating apparatus according to yet another embodiment of the present invention.
Figure 47:
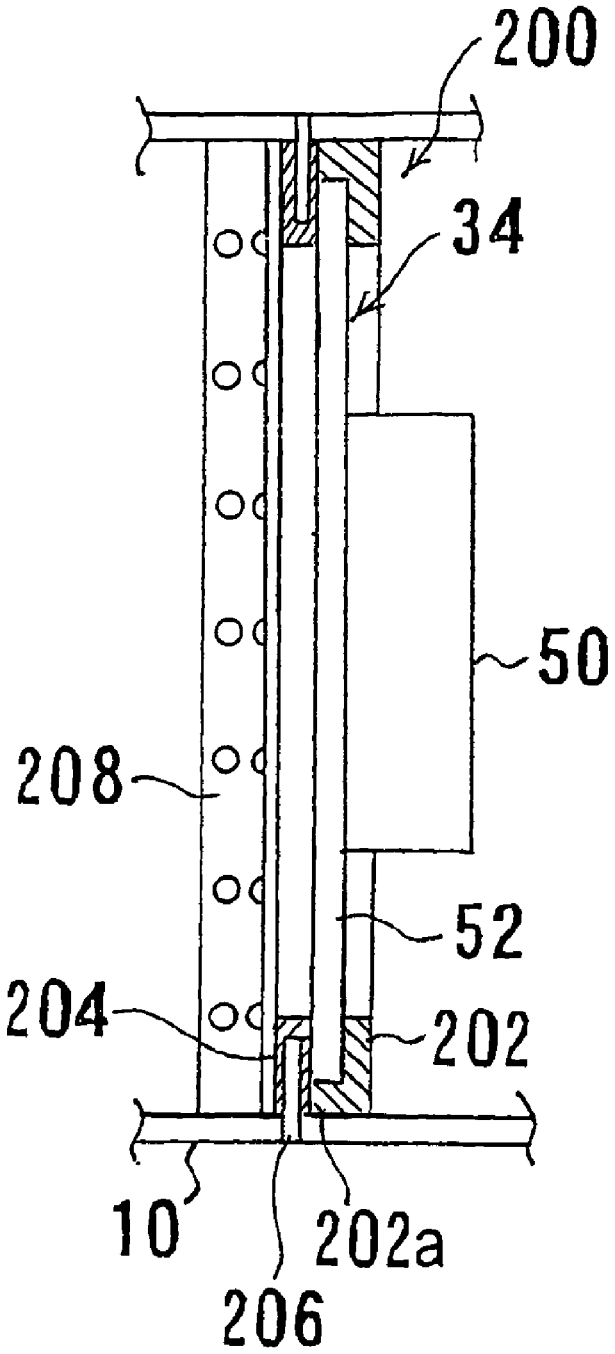
FIG. 47 is a cross-sectional plan view showing a regulation plate holder of the plating apparatus shown in FIG. 46 together with the regulation plate.
Figure 48:
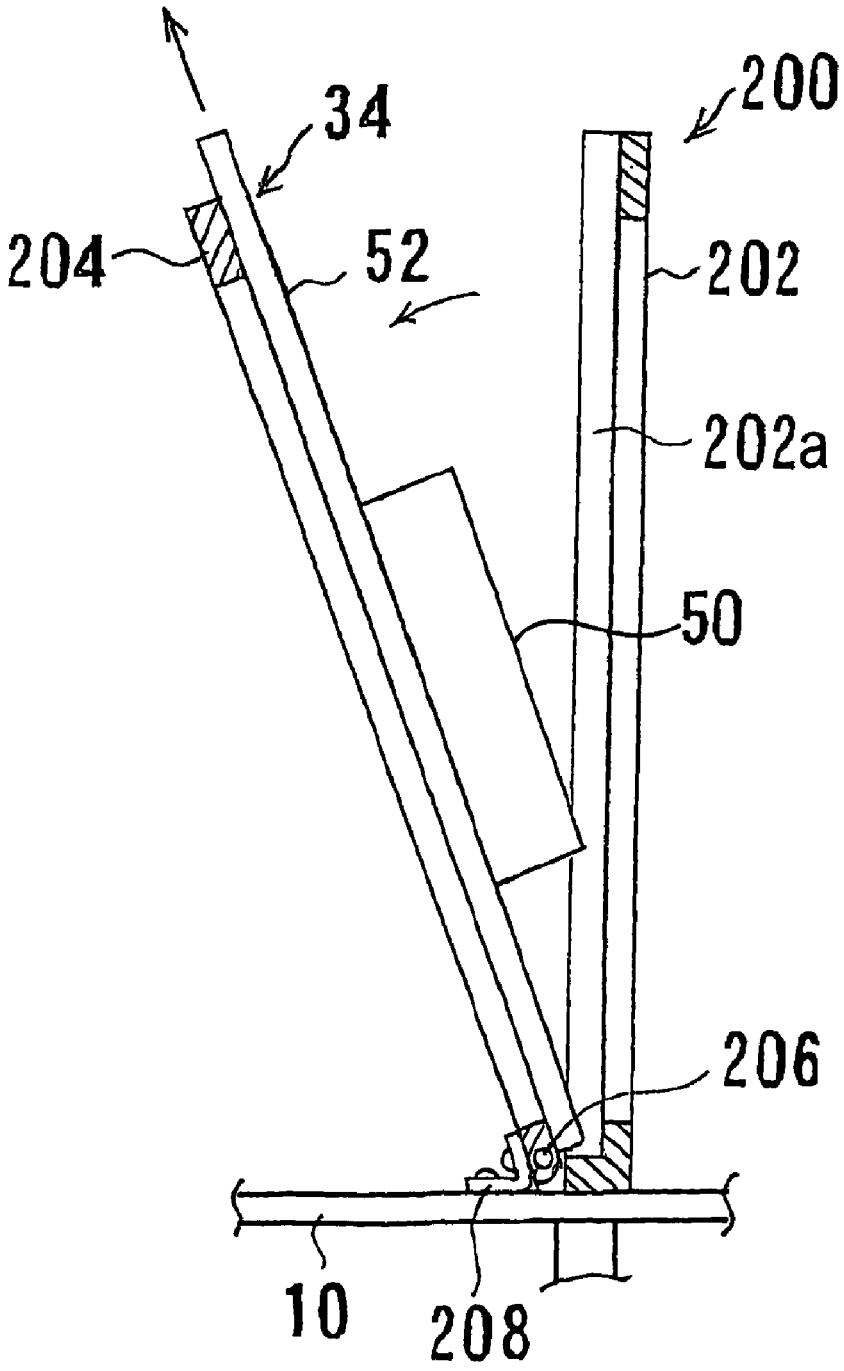
FIG. 48 is a sectional view of the regulation plate holder when the regulation plate is released from the regulation plate holder.

FIGS. 46 through 48 show a plating apparatus according to yet another embodiment of the present invention. The plating apparatus of this embodiment differs from the plating apparatus shown in FIG. 1 in that a regulation plate holder 200 for detachably holding the regulation plate 34 comprised of the cylindrical portion 50 and the rectangular flange portion 52, is provided at a predetermined position on the inner peripheral surface of the plating tank 10. The regulation plate holder 200 is comprised of a fixed holder 202 and a movable holder 204, each having a rectangular frame-like shape which is slightly larger than the flange portion 52 of the regulation plate 34. The fixed holder 202 has, at its bottom and both side ends, a protruding portion 202a that protrudes toward the movable holder 204. The height of the protruding portion 202a is approximately the same as a thickness of the flange portion 52 of the regulation plate 34.

The fixed holder 202, at its bottom and both side ends, is fixed on the inner peripheral surface of the plating tank 10, and the movable holder 204, at its lower end, is rotatably supported on the plating tank 10 via a hinge pin 206. When the movable holder 204 is rotated toward the fixed holder 202, the bottom and both side ends of the movable holder 204 come into contact with the top of the protruding portion 202a of the fixed holder 202, thereby forming between the fixed holder 202 and the movable holder 204 an upwardly-open space which has approximately the same thickness as the thickness of the flange portion 52 of the regulation plate 34 and in which the regulation plate 34 is to be located.

An electric field-shielding member 208, e.g., comprised of a rubber sheet, whose lower end is in elastic contact with the bottom of the plating tank 10, is attached to the lower end of the movable holder 204 in order to prevent leakage of electric field from between the movable holder 204 and the bottom of the plating tank 10.

According to this embodiment, the regulation plate 34 can be held in the regulation plate holder 200, with the peripheral end of the regulation plate 34 sandwiched between the fixed holder 202 and the movable holder 204, by disposing the regulation plate 34 between the fixed holder 202 and the movable holder 204, rotating the movable holder 204 toward the fixed holder 202 and fixing the movable holder 204, e.g., by a clamper (not shown). By thus holding the regulation plate 34 in the regulation plate holder 200, leakage of electric field from between the fixed holder 202 and the movable holder 204 can be prevented.

The regulation plate 34 can be released from the regulation plate holder 200 by first unfixing the movable holder 204, then rotating the movable holder 204 away from the fixed holder 202, as shown in FIG. 48, and then drawing the regulation plate 34 obliquely upward from the movable holder 204.

By the provision of the regulation plate holder 200, which can detachably hold the regulation plate 34, at a predetermined position in the plating tank 10, replacement of the regulation plate 34 can be performed easily and quickly.

While the present invention has been described with reference to the embodiments thereof, it will be understood by those skilled in the art that the present invention is not limited to the particular embodiments described above, but it is intended to cover modifications within the inventive concept.

What is claimed is:

1. An electroplating apparatus for electroplating an object, comprising:

a plating tank for holding a plating solution containing additives;

an anode to be immersed in the plating solution in said plating tank; and an object holder for holding the object, said object holder being configured so that a surface of the object to be held by said object holder will be immersed in the plating solution and will be located within said plating tank at a position opposite said anode when the object is held by said object holder;

wherein said plating tank is separated into a plating object processing chamber and a plating solution distribution chamber by a separation plate having a large number of plating solution passage holes; and wherein said plating solution distribution chamber has a shield plate configured to regulate an electric field while ensuring distributed flows of the plating solution.

2. The electroplating apparatus of claim 1, further comprising:

a regulation plate between said anode and said object holder, said regulation plate being formed of dielectric material and including:

a cylindrical portion having an inner periphery with a shape corresponding to a shape of an outer periphery of the object; and a flange portion connected to an anode-side peripheral end of said cylindrical portion, said flange portion being configured to regulate an electric field formed between said anode and the object; and an electric field-shielding member in contact with said separation plate and attached to a lower end of said flange portion.

3. The electroplating apparatus of claim 1, wherein said plating solution distribution chamber is separated by said shield plate into an anode-side solution distribution chamber and a cathode-side solution distribution chamber, and a plating solution supply route is configured to supply the plating solution to said anode-side solution distribution chamber and said cathode-side solution distribution chamber.

4. The electroplating apparatus of claim 1, further comprising a paddle plate between said anode and said object holder for stirring the plating solution.

5. The electroplating apparatus of claim 4, wherein said paddle plate has a plurality of vertically-extending strip-shaped portions, said electroplating apparatus further comprising:

a paddle drive section for moving said paddle plate; and a controller for controlling said paddle drive section so as to move said paddle plate in a reciprocating manner along the surface of the object such that, when said paddle plate is located at a farthest-right position, said strip-shaped portions do not cover the same portion of the surface of the object covered by said strip-shaped portions when said paddle plate is located at a farthest-left position.

6. The electroplating apparatus of claim 1, further comprising a regulation plate between said anode and said object holder, said regulation plate including a cylindrical portion having an inner periphery with a shape corresponding to a shape of an outer periphery of the object.

7. The electroplating apparatus of claim 6, wherein said regulation plate further includes a flange portion through which said cylindrical portion extends.

8. The electroplating apparatus of claim 1, wherein said object holder is movable so as to transport the object.

9. An electroplating apparatus for electroplating an object, comprising:

a plating tank for holding a plating solution containing additives;

an anode to be immersed in the plating solution in said plating tank;

an anode holder for holding said anode;

a substrate holder for holding the substrate, said substrate holder being configured so that a surface of the substrate to be held by said substrate holder will be immersed in the plating solution and will be located within said plating tank at a position opposite said anode when the substrate is held by said substrate holder;

a regulation plate located between said anode and the substrate held by said substrate holder, said regulation plate having an opening for regulating a distribution of electric potential; *and*

[a diaphragm covering an entirety of said opening of said regulation plate; and]

a positioning/holding section comprising a single unitary member detachably holding each of said anode holder, said substrate holder, and said regulation plate such that a central axis of said anode held by said anode holder, a central axis of the substrate to be held by said substrate holder, and a central axis of said opening of said regulation plate are coaxial.

10. The electroplating apparatus of claim 9, further comprising a paddle plate between said regulation plate and said substrate holder for stirring the plating solution.

11. The electroplating apparatus of claim 10, wherein said paddle plate has a plurality of vertically-extending strip-shaped portions, said electroplating apparatus further comprising:

a paddle drive section for moving said paddle plate; and a controller for controlling said paddle drive section so as to move said paddle plate in a reciprocating manner along the surface of the substrate such that, when said paddle plate is located at a farthest-right position, said strip-shaped portions do not cover the same portion of the surface of the substrate covered by said strip-shaped portions when said paddle plate is located at a farthest-left position.

12. The electroplating apparatus of claim 9, wherein said regulation plate includes a cylindrical portion having an inner periphery with a shape corresponding to a shape of an outer periphery of the substrate.

13. The electroplating apparatus of claim 12, wherein said regulation plate further includes a flange portion through which said cylindrical portion extends.

14. The electroplating apparatus of claim 9, wherein said substrate holder is movable so as to transport the substrate.

15. An electroplating apparatus for electroplating an object, comprising:

a plating tank for holding a plating solution containing additives, said plating tank having a processing chamber with a bottom surface;

an anode to be immersed in the plating solution in said plating tank;

a substrate holder for holding the substrate, said substrate holder being configured so that a surface of the substrate to be held by said substrate holder will be immersed in the plating solution and will be located within said plating tank at a position opposite said anode when the substrate is held by said substrate holder;

a regulation plate located between said anode and the substrate held by said substrate holder, said regulation plate having an opening for regulating a distribution of electric potential;

a diaphragm covering an entirety of said opening of said regulation plate; and an elastic electric field-shielding member located at a lower end of said regulation plate on an anode-facing side of said regulation plate such that a lower end of said electric field-shielding member elastically contacts said bottom surface of said processing chamber of said plating tank, said electric field-shielding member being configured to prevent leakage of electric current between said regulation plate and said bottom surface of said processing chamber of said plating tank.

16. The electroplating apparatus of claim 15, further comprising a paddle plate between said regulation plate and said substrate holder for stirring the plating solution.

17. The electroplating apparatus of claim 16, wherein said paddle plate has a plurality of vertically-extending strip-shaped portions, said electroplating apparatus further comprising:

a paddle drive section for moving said paddle plate; and a controller for controlling said paddle drive section so as to move said paddle plate in a reciprocating manner along the surface of the substrate such that, when said paddle plate is located at a farthest-right position, said strip-shaped portions do not cover the same portion of the surface of the substrate covered by said strip-shaped portions when said paddle plate is located at a farthest-left position.

18. The electroplating apparatus of claim 15, wherein said regulation plate includes a cylindrical portion having an inner periphery with a shape corresponding to a shape of an outer periphery of the substrate.

19. The electroplating apparatus of claim 18, wherein said regulation plate further includes a flange portion through which said cylindrical portion extends.

20. The electroplating apparatus of claim 15, wherein said substrate holder is movable so as to transport the substrate.

21. The electroplating apparatus of claim 15, wherein said electric field-shielding member comprises a rubber sheet.

*22. The electroplating apparatus of claim 9, further comprising a diaphragm covering an entirety of said opening of said regulation plate.*

* * * * *